US010325853B2

(12) United States Patent
Yu et al.

(10) Patent No.: US 10,325,853 B2
(45) Date of Patent: Jun. 18, 2019

(54) METHOD OF FORMING SEMICONDUCTOR PACKAGES HAVING THROUGH PACKAGE VIAS

(71) Applicant: Taiwan Semiconductor Manufacturing Company, Ltd., Hsin-Chu (TW)

(72) Inventors: Chen-Hua Yu, Hsin-Chu (TW); Chung-Shi Liu, Hsin-Chu (TW); Chih-Wei Lin, Zhubei (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/696,198

(22) Filed: Apr. 24, 2015

(65) Prior Publication Data
US 2016/0163564 A1 Jun. 9, 2016

Related U.S. Application Data

(60) Provisional application No. 62/087,167, filed on Dec. 3, 2014.

(51) Int. Cl.
*H01L 21/56* (2006.01)
*H01L 23/00* (2006.01)
(Continued)

(52) U.S. Cl.
CPC .......... *H01L 23/5384* (2013.01); *H01L 21/56* (2013.01); *H01L 23/3128* (2013.01); *H01L 23/49805* (2013.01); *H01L 23/49827* (2013.01); *H01L 23/49838* (2013.01); *H01L 23/5386* (2013.01); *H01L 24/19* (2013.01); *H01L 24/20* (2013.01); *H01L 24/73* (2013.01);
(Continued)

(58) Field of Classification Search
CPC ........... H01L 2224/13023; H01L 2224/13025; H01L 2224/12105; H01L 2224/13016; H01L 21/568; H01L 23/49827; H01L 23/5384; H01L 23/5389; H01L 53/49827; H01L 21/56; H01L 23/3121–3128; H01L 23/28–3192; H01L 24/18–25
See application file for complete search history.

(56) References Cited

U.S. PATENT DOCUMENTS 8,176,628 B1 * 5/2012 Rusli .................... H01L 21/4853
174/261
2006/0272854 A1 * 12/2006 Yamano .............. H01L 23/3677
174/264

(Continued)

FOREIGN PATENT DOCUMENTS

CN 103681367 A 3/2014

*Primary Examiner* — Kevin Parendo
(74) *Attorney, Agent, or Firm* — Slater Matsil, LLP

(57) ABSTRACT

A semiconductor device and method for forming the semiconductor device is provided. The semiconductor device includes an integrated circuit having through vias adjacent to the integrated circuit die, wherein a molding compound is interposed between the integrated circuit die and the through vias. The through vias have a projection extending through a patterned layer, and the through vias may be offset from a surface of the patterned layer. The recess may be formed by selectively removing a seed layer used to form the through vias.

20 Claims, 30 Drawing Sheets

(51) Int. Cl.
*H01L 23/31* (2006.01)
*H01L 25/10* (2006.01)
*H01L 23/498* (2006.01)
*H01L 23/538* (2006.01)

(52) U.S. Cl.
CPC ............ *H01L 24/92* (2013.01); *H01L 25/105* (2013.01); *H01L 21/568* (2013.01); *H01L 23/49816* (2013.01); *H01L 23/5389* (2013.01); *H01L 24/32* (2013.01); *H01L 24/83* (2013.01); *H01L 2224/04105* (2013.01); *H01L 2224/12105* (2013.01); *H01L 2224/19* (2013.01); *H01L 2224/2101* (2013.01); *H01L 2224/214* (2013.01); *H01L 2224/27334* (2013.01); *H01L 2224/32225* (2013.01); *H01L 2224/73267* (2013.01); *H01L 2224/92244* (2013.01); *H01L 2225/1035* (2013.01); *H01L 2225/1058* (2013.01); *H01L 2924/141* (2013.01); *H01L 2924/143* (2013.01); *H01L 2924/1431* (2013.01); *H01L 2924/1432* (2013.01); *H01L 2924/1434* (2013.01); *H01L 2924/1436* (2013.01); *H01L 2924/1437* (2013.01); *H01L 2924/1533* (2013.01); *H01L 2924/15311* (2013.01)

(56) References Cited

U.S. PATENT DOCUMENTS

| | | |
|---|---|---|
| 2007/0141757 A1 | 6/2007 | Nomura |
| 2010/0065322 A1 | 3/2010 | Ogawa et al. |
| 2010/0263923 A1* | 10/2010 | Kodani et al. ................ 174/260 |
| 2011/0133333 A1 | 6/2011 | Kwon et al. |
| 2011/0201197 A1* | 8/2011 | Nilsson et al. ............... 438/638 |
| 2012/0007234 A1* | 1/2012 | Tsai ...................... H01L 21/565 257/737 |
| 2012/0315753 A1* | 12/2012 | Farooq ............. H01L 21/76898 438/653 |
| 2013/0049217 A1* | 2/2013 | Gong ................ H01L 23/49822 257/774 |
| 2013/0062108 A1 | 3/2013 | Kondo |
| 2013/0069245 A1* | 3/2013 | Uchiyama ............... H01L 24/24 257/774 |
| 2014/0141569 A1 | 5/2014 | Jo et al. |
| 2014/0210101 A1 | 7/2014 | Lin et al. |
| 2015/0179591 A1* | 6/2015 | Tsai ........................ H01L 21/486 257/774 |
| 2015/0279818 A1* | 10/2015 | Hsu ......................... H01L 24/19 257/737 |

\* cited by examiner

METHOD OF FORMING SEMICONDUCTOR PACKAGES HAVING THROUGH PACKAGE VIAS

PRIORITY CLAIM AND CROSS-REFERENCE

This application claims priority to and the benefit of U.S. Provisional Application Ser. No. 62/087,167, filed on Dec. 3, 2014 and entitled "Semiconductor Packages and Methods of Forming the Same," which application is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
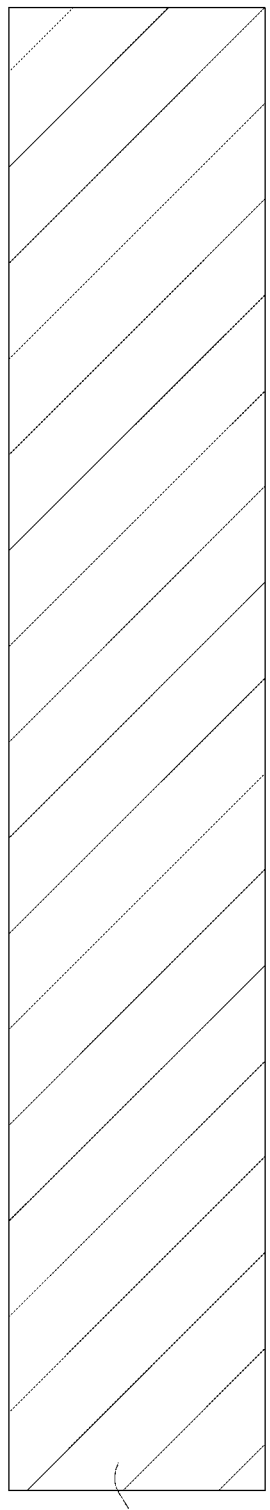
FIGS. 1-16 are cross-sectional views of various intermediate steps of forming semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a three dimensional (3D) integrated fan-out (InFO) package-on-package (PoP) device. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1 through 16 illustrate cross-sectional views of intermediate steps in forming a semiconductor package in accordance with some embodiments. FIG. 1 is a cross-sectional view of a carrier substrate 40. The carrier substrate 40 comprises, for example, silicon based materials, such as a silicon wafer, glass or silicon oxide, or other materials, such as aluminum oxide, a ceramic material, combinations of any of these materials, or the like. In some embodiments, the carrier substrate 40 is planar in order to accommodate further processing. In some embodiments, the carrier substrate 40 may be a wafer on which multiple package structures are formed. The carrier substrate 40 may be any suitable substrate that provides (during intermediary operations of the fabrication process) mechanical support for the layers over the carrier substrate 40.

Figure 2:
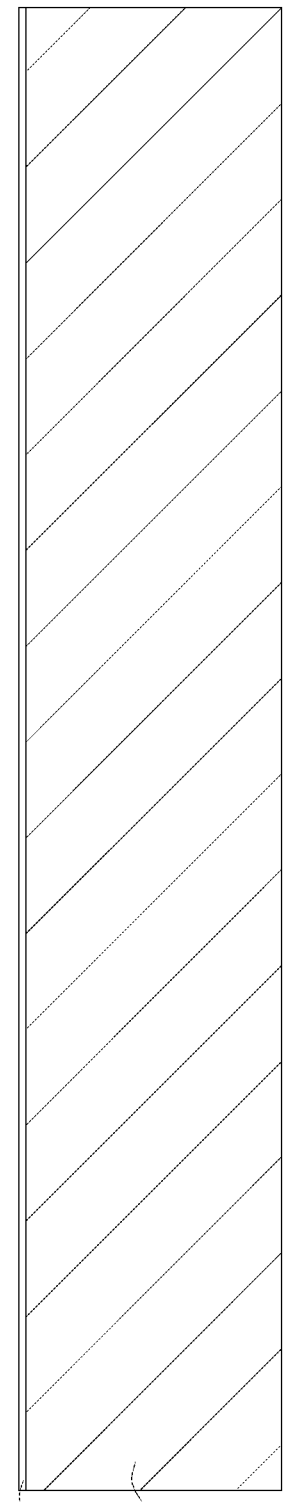

FIG. 2 is a cross-sectional view of a release layer 42 on the carrier substrate 40 in accordance with some embodiments. The release layer 42 may be formed of a polymer-based material, which may be removed along with the carrier substrate 40 from the overlying structures that will be formed in subsequent steps. In some embodiments, the release layer 42 is an epoxy-based thermal release material, which loses its adhesive property when heated, such as a Light-to-Heat-Conversion (LTHC) release coating. In other embodiments, the release layer 42 may be an ultra-violet (UV) glue, which loses its adhesive property when exposed to UV light. The release layer 42 may be dispensed as a liquid and cured, may be a laminate film laminated onto the carrier substrate 40, or the like.

Figure 3:
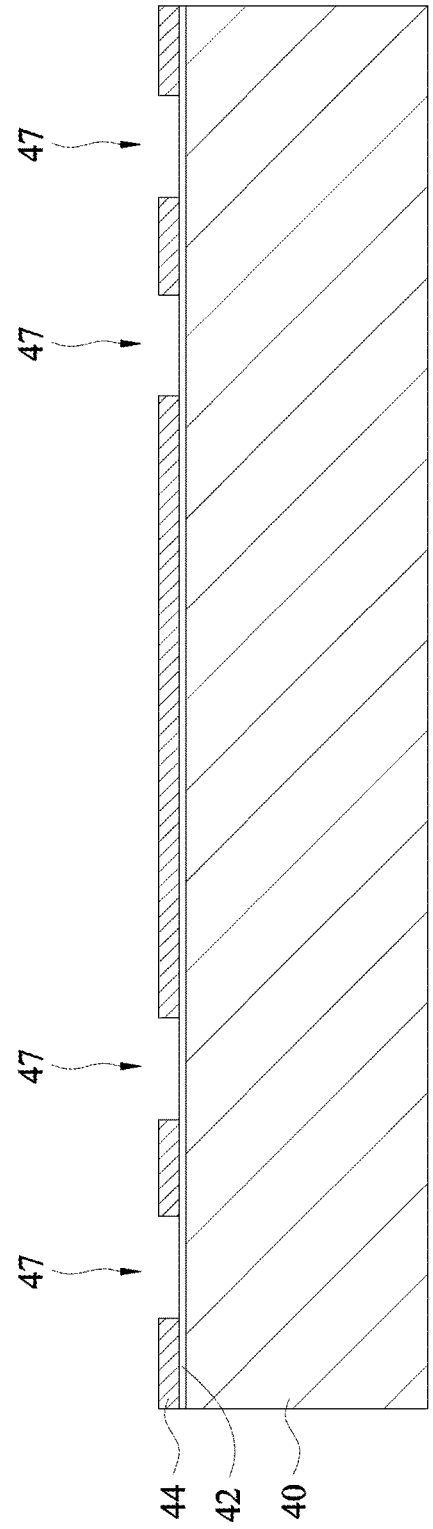

FIG. 3 is a cross-sectional view of a first patterned layer 44 on the release layer 42 in accordance with some embodiments. As will be discussed in greater detail below, the first patterned layer 44 is patterned with openings, in which through vias formed in subsequent processes will extend. The first patterned layer 44 may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped Phospho-Silicate Glass (BPSG), or a combination thereof, or the like), or the like, and may be formed, for example, by spin coating, lamination, Chemical Vapor Deposition (CVD), or the like. In some embodiments, the first patterned layer 44 is a photoresist material and is patterned by exposing to light through the patterned mask, creating first openings 47 in photoresist material.

Figure 4:
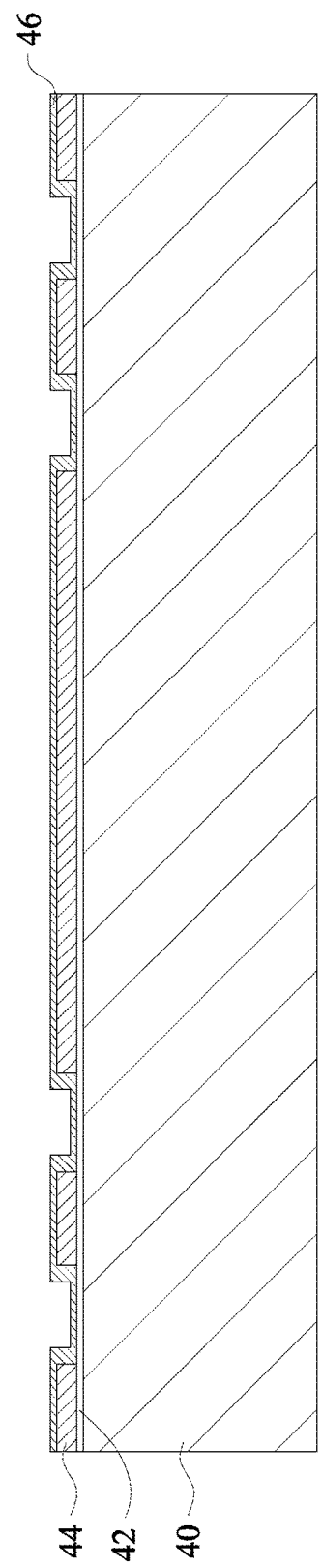

FIG. 4 is a cross-sectional view of a seed layer 46 of a subsequently formed through via over the first patterned layer 44 and a portion of the release layer 42 in accordance with some embodiments. The seed layer 46 may be formed over the first patterned layer 44 and in the first openings 47 formed in the first patterned layer 44. In some embodiments, the seed layer 46 is a metal layer, which may be a single layer or a composite layer comprising a plurality of sub-layers formed of different materials. The seed layer 46 may be made of copper, titanium, nickel, gold, or a combination thereof, or the like. In some embodiments, the seed layer 46 comprises a titanium layer and a copper layer over the titanium layer. The seed layer 46 may be formed using, for example, physical vapor deposition (PVD), chemical vapor deposition (CVD), atomic layer deposition (ALD), a combination thereof, or the like. The seed layer 46 may comprise one or more layers.

As will be discussed in greater detail below, the seed layer 46 will be utilized to form through vias, after which, a portion of the seed layer 46 may be removed to form a recess. The thickness of the seed layer 46, or if a composite seed layer is utilized, one or more layers of the composite seed layer, may be used to control a recess depth from a bottom surface of the first patterned layer 44 to the through vias 50 (see FIG. 6). Accordingly, the thicknesses and the materials of the seed layer 46 may be selected to aid in the control of the recess. For example, in some embodiments, the seed layer 44 may comprise a layer of titanium and an overlying copper layer. In this embodiment, the titanium layer may be selectively removed, creating a recess and exposing the copper layer. In some embodiments, a first seed layer (e.g., a layer of titanium) has a thickness of about 0.01 µm to about 5 µm, and a second seed layer (e.g., a layer of copper) has a thickness of about 0.01 µm to about 5 µm. In other embodiments, other materials may be utilized.

Figure 5:
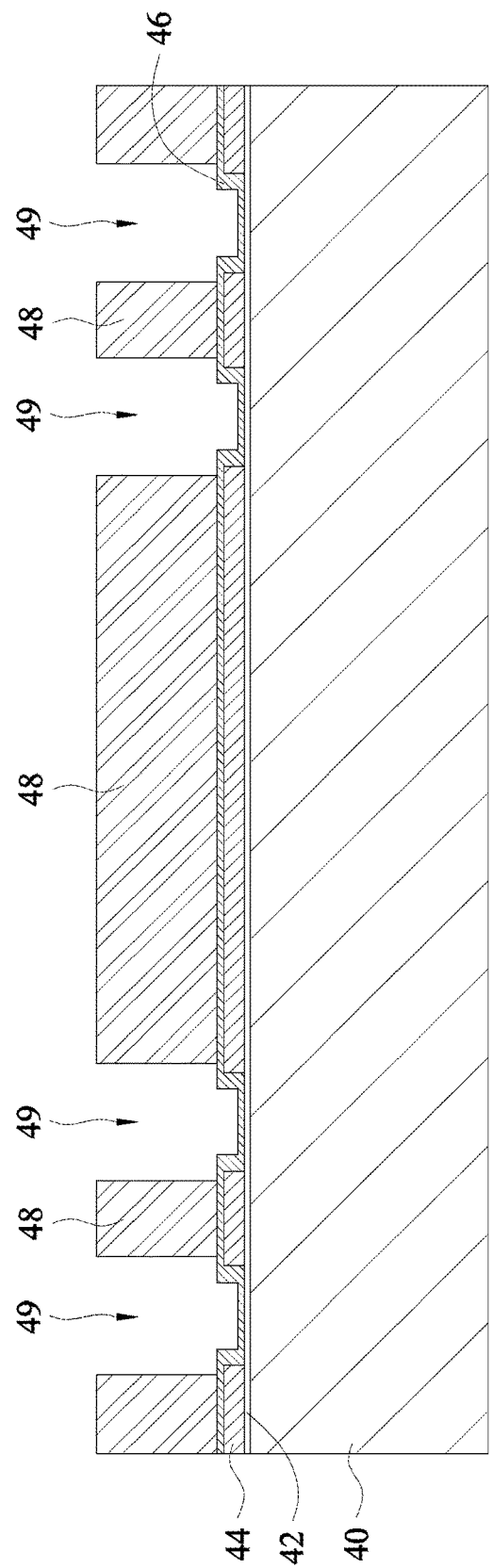

FIG. 5 is a cross-sectional view of a second patterned layer 48 over the seed layer 46 with second openings 49 to expose at least a portion of the first openings 47 in accordance with some embodiments. The second patterned layer 48 may be formed by a wet process, such as a spin-on process, or by a dry process, or applying a dry film, and may be exposed to light for patterning. The patterning forms second openings 49 through the second patterned layer 48 to expose a portion of the seed layer 46 and the first openings 47, and the width of the second openings 49 may be wider than the width of the first openings 47. In some embodiments, the second patterned layer 48 comprises a photoresist layer and is patterned using photolithography techniques. In another embodiment, other materials such as silicon oxide or silicon nitride may be used as the second patterned layer 48.

Figure 6:
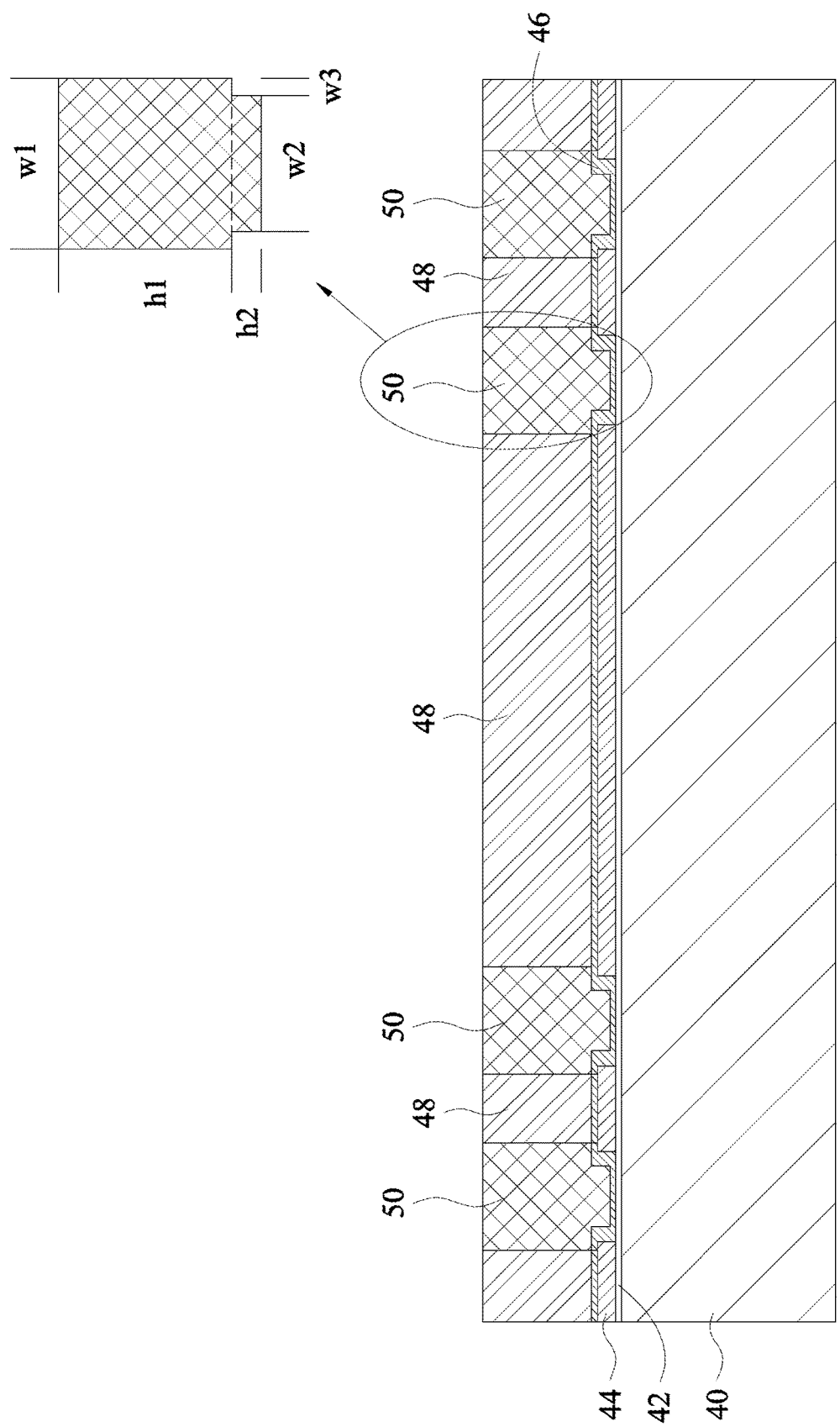

FIG. 6 is a cross-sectional view of a conductive material filling the first openings 47 (see FIG. 3) and the second openings 49 (see FIG. 5) of the second patterned layer 48 on the exposed portions of the seed layer 46 to form through vias 50 in accordance with some embodiments. The conductive material may be formed by plating, such as electroplating or electroless plating, or the like. The conductive material may comprise a metal, like copper, titanium, tungsten, aluminum, or a combination thereof, or the like, and may have a composite structure including a plurality of layers. As illustrated in FIG. 6, the through vias 50 comprise a body portion having a first width w1 and a narrow projection having a second width w2 as the through vias 50 extend through the first patterned layer 44. The through vias 50 include a ledge or a recess having a width w3 between the first width w1 and the second width w2. The first width w1 of the through vias 50 may be in a range from about 20 µm to about 500 µm, the second width of w2 may be in a range from about 20 µm to about 500 µm, and the third width of w3 may be in a range from about 0 µm to about 100 µm. A first height h1 of the body portion of the through vias 50 may be in a range from about 20 µm to about 1000 µm, and a second height h2 of the narrow projection of the through vias 50 may be in a range from about 0.01 µm to about 50 µm.

Figure 7:
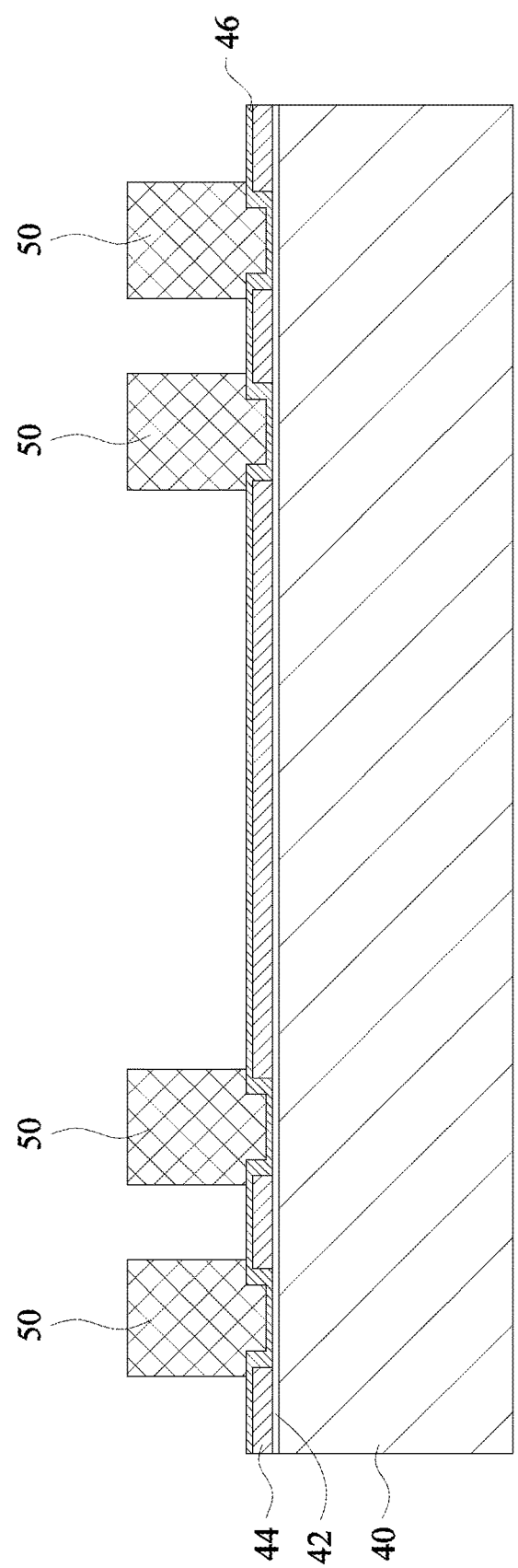

FIG. 7 is a cross-sectional view of the through vias 50 after removing the second patterned layer 48 (see FIG. 6) in accordance with some embodiments. In some embodiments, in which the second patterned layer 48 comprises a photoresist material, the second patterned layer 48 may be removed by an acceptable ashing or stripping process, such as using an oxygen plasma or the like, and it may also be removed by rinsing in Acetone, Isopropanol, and deionized water, or the like. Once the second patterned layer 48 is removed, portions of the seed layer 46 that are not covered by the through vias 50 are exposed.

Figure 8:
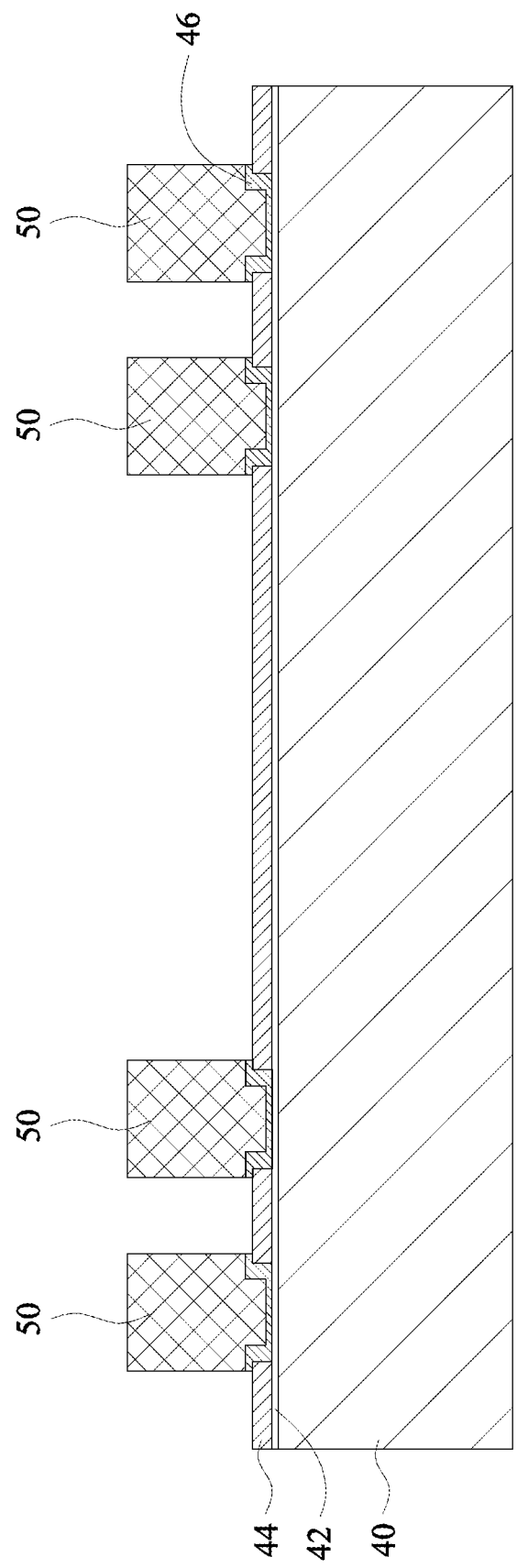

FIG. 8 illustrates removal of exposed seed layer 46 in accordance with some embodiments. The exposed seed layer 46 may be removed by, for example, using an acceptable etching process, such as by wet or dry etching, to expose at least a portion of the first patterned layer 44.

Figure 9:
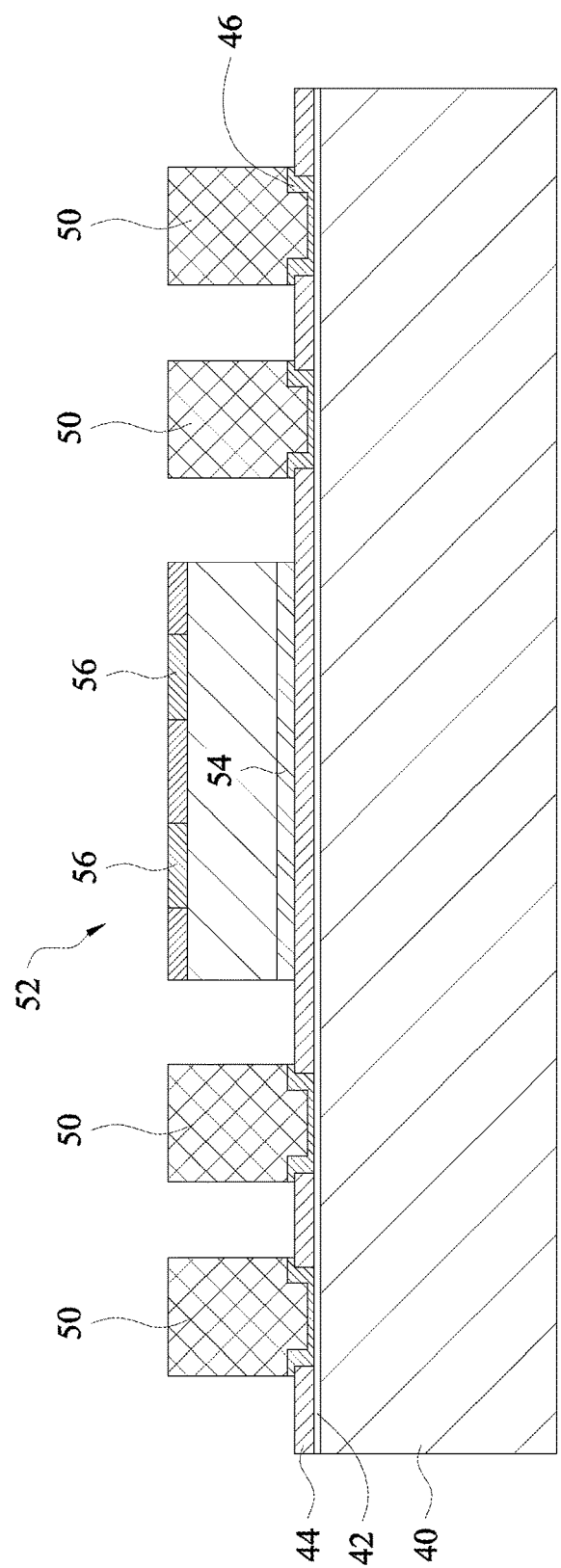

FIG. 9 illustrates attaching an integrated circuit die 52 to the first patterned layer 44 in accordance with some embodiments. In some embodiments, the integrated circuit die 52 may be adhered to the first patterned layer 44 by an adhesive 54, such as a die-attach film (DAF). A thickness of the adhesive 54 may be in a range from about 0.01 µm to about 100 µm. The integrated circuit die 52 may be a single die as illustrated in FIG. 9, or in some embodiments, two or more than two dies may be attached, and may include any die suitable for a particular approach. For example, the integrated circuit die 52 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. The integrated circuit die 52 may be attached to a suitable location for a particular design or application. For example, FIG. 9 illustrates an embodiment in which the integrated circuit die 52 is mounted in a center region wherein the through vias 50 are positioned around a perimeter. In other embodiments, the integrated circuit die 52 may be offset from a center. Before being attached to the first patterned layer 44, the integrated circuit die 52 may be processed according to applicable manufacturing processes to form integrated circuits in the integrated circuit die 52.

In some embodiments, the integrated circuit die 52 is mounted to the first patterned layer 44 such that die connectors 56 are facing away from or distal to the first patterned layer 44. The die connectors 56 provide an electrical connection to the electrical circuitry formed on the integrated circuit die 52. The die connectors 56 may be formed on an active side of the integrated circuit die 52, or may be formed on a backside and comprise through vias. The die connectors 56 may further comprise through vias providing an electrical connection between a first side and a second side of the integrated circuit die 52. In an embodiment, the conductive material of the die connectors 56 is copper, tungsten, aluminum, silver, gold, tin, a combination thereof, or the like.

Figure 10:
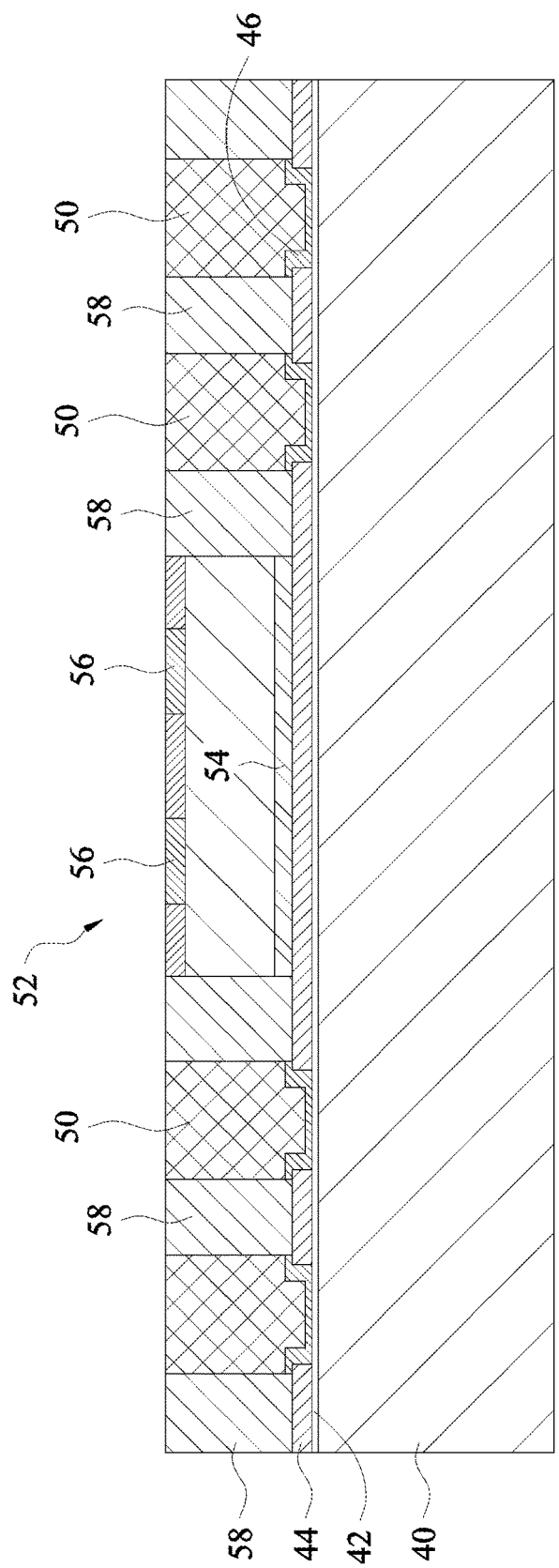

FIG. 10 illustrates encapsulating the integrated circuit die 52 and the through vias 50 by an encapsulant 58 in accordance with some embodiments. The encapsulant 58 is placed in gaps between the integrated circuit die 52 and around the through vias 50. The encapsulant 58 may be molded on the integrated circuit die 52 and the through vias 50 using, for example, compression molding. In some embodiments, the encapsulant 58 is made of a molding compound, a polymer, an epoxy, silicon oxide filler material, the like, or a combination thereof. A curing step may be performed to cure and solidify the encapsulant 58, wherein the curing may be a thermal curing, a UV curing, the like, or a combination thereof. Other encapsulating processes may be used, such as lamination, compression molding, or the like.

In some embodiments, the molding material completely covers the upper surfaces of the integrated circuit die 52. In these embodiments, a planarization step, such as a grinding, may be performed on the molding material 58 to expose the integrated circuit die 52 and the die connectors 56. In some embodiments, surfaces of the die connectors 56 and surfaces of the through vias 50 are planar with a surface of the molding material 58. The through vias 50 may be referred to as through molding vias (TMVs), through package vias (TPVs), and/or through InFO (Integrated Fan-Out) vias (TIVs).

Figure 11:
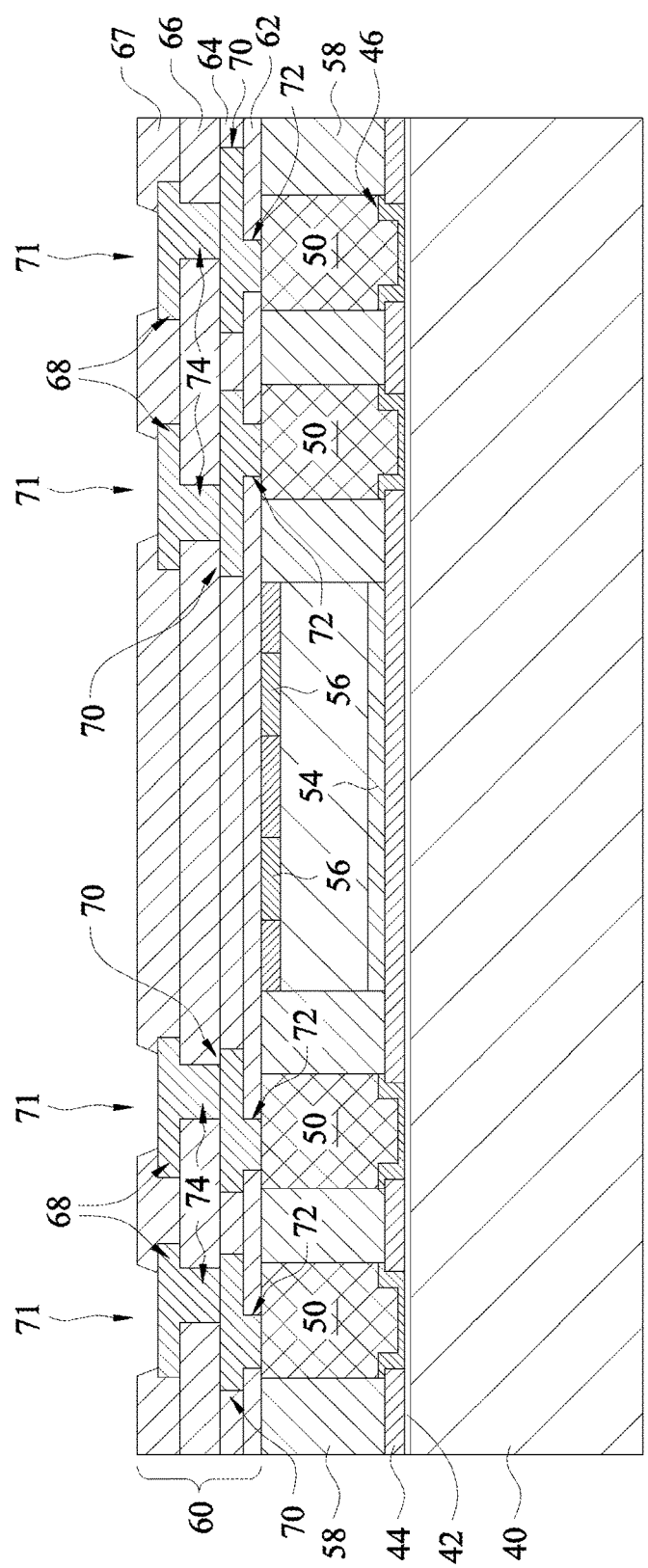

FIG. 11 illustrates formation of a redistribution structure 60 in accordance with some embodiments. The redistribution structure 60 may comprise any number of dielectric layers, metallization patterns, and vias. For example, FIG. 11 illustrates an embodiment in which the redistribution structure 60 includes three dielectric layers 62, 64, 66 with respective metallization patterns and vias, as will be discussed below, although other embodiments may have fewer or more.

The first dielectric layer 62 is formed on the encapsulant 58 and die connectors 56. In some embodiments, the first dielectric layer 62 is formed of a polymer, which may be a photo-sensitive material such as polybenzoxazole (PBO), polyimide, benzocyclobutene (BCB), or the like, that may be patterned using lithography. In other embodiments, the first dielectric layer 62 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer 62 may be formed by spin coating, lamination, Chemical Vapor Deposition (CVD), the like, or a combination thereof. The first dielectric layer 62 is then patterned to form openings to expose portions of the die connectors 56 and the through vias 50. The patterning may be by an acceptable process, such as by exposing the first dielectric layer 62 to light when the dielectric layer is a photo-sensitive material or by etching using, for example, a patterned mask and an anisotropic etch.

First metallization pattern 70 with vias 72 is formed on the first dielectric layer 62. As an example to form first metallization pattern 70 and vias 72, a seed layer (not shown) is formed over the first dielectric layer 62 and in the openings formed in the first dielectric layer 62. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A mask is then formed and patterned on the seed layer in accordance with a desired redistribution pattern. In some embodiments, the mask is a photoresist formed by spin coating or the like and exposed to light for patterning. The pattern of the mask corresponds to the first metallization pattern 70 with vias 72. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the first metallization pattern 70 and vias 72. The second dielectric layer 64 is formed over the first dielectric layer 62 to provide a more planar surface for subsequent layers. In some embodiments, the second dielectric layer 64 is formed of polymer, a nitride, an oxide, or the like. In some embodiments, the second dielectric layer 64 is PBO formed by a spin-on process.

A third dielectric layer 66, second metallization pattern 68, and vias 74 are formed on the second dielectric layer 64 and first metallization pattern 70. The third dielectric layer 66, second metallization pattern 68, and vias 74 can be formed using similar processes with similar materials as used for forming the first dielectric layer 62, first metallization pattern 70, and vias 72 as discussed above. The vias 74 interconnect metallization patterns 68 and 70. A fourth dielectric layer 67 is formed on the third dielectric layer 66 and surrounding the second metallization pattern 68. In some embodiments, the fourth dielectric layer 67 is formed of a polymer, which may be a photo-sensitive material such as PBO, polyimide, BCB, or the like, that may be patterned using a lithography mask. In other embodiments, the fourth dielectric layer 67 is formed of a nitride or an oxide such as silicon nitride, silicon oxide, PSG, BSG, BPSG, or the like. The fourth dielectric layer 67 may be formed by spin coating, lamination, CVD, the like, or a combination thereof. The fourth dielectric layer 67 is then patterned to create third openings 71. The patterning may be by an acceptable process, such as by exposing the fourth dielectric layer 67 to light when the dielectric layer is a photo-sensitive material or by etching using, for example, an anisotropic etch.

The redistribution layer 60 may be referred to as a front side redistribution layer on the integrated circuit die 52. This front side redistribution layer 60 may be utilized to provide an external electrical connection to the integrated circuit die 52 and/or to electrically couple the integrated circuit die 52 to the through vias 50, which by be electrically coupled to one or more other packages, package substrates, components, the like, or a combination thereof. The numbers of illustrated metallization layers in the redistribution layer 60 are only for illustrative purposes and are not limiting. There may be any number of dielectric layers and metallization patterns different from those illustrated in FIG. 11.

Figure 12:
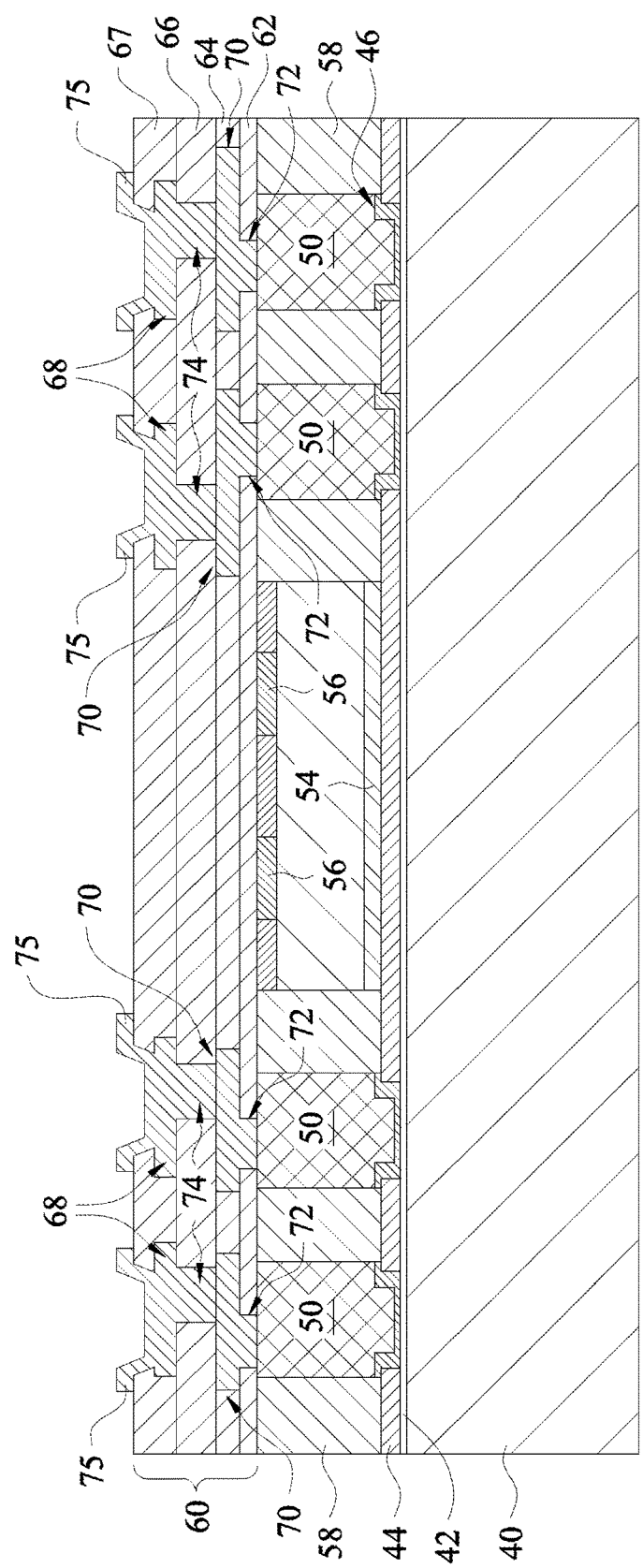

FIG. 12 illustrates a formation of under bump metallizations (UBMs) 75 in the third openings 71 (see FIG. 11) in accordance with some embodiments. The UBMs 75 may comprise multiple layers, such as a layer of titanium, followed by a layer of copper, and a third layer of Ni. In some embodiments, the UBMs 75 may comprises a layer of titanium (Ti) layer, a tantalum (Ta) layer, and a tantalum nitride (TaN) layer. The UBM pad may be patterned by electro-plating or electroless-plating method.

Figure 13:
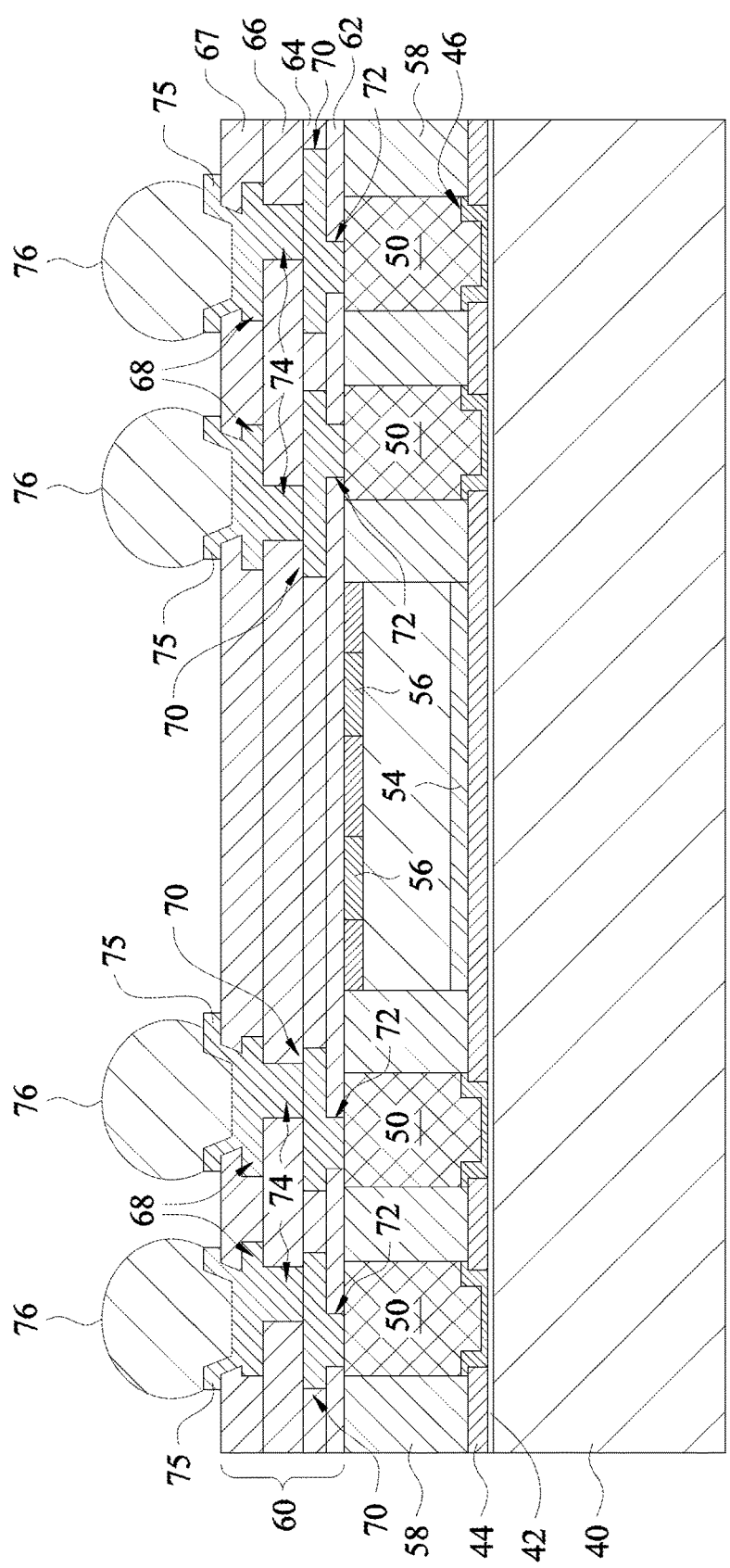

FIG. 13 illustrates the formation of a set of conductive connectors 76 over the UBMs 75 and electrically coupled to the redistribution layer 60. The conductive connectors 76 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The conductive connectors 76 may include a conductive material such as solder, copper, aluminum, gold, nickel, silver, palladium, tin, the like, or a combination thereof. In an embodiment in which the conductive connectors 76 are solder bumps, the conductive connectors 76 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 76 are metal pillars (such as a copper pillar) formed by a sputtering, printing, electro plating, electroless plating, CVD, or the like. The metal pillars may be solder free and have substantially vertical sidewalls.

Figure 14:
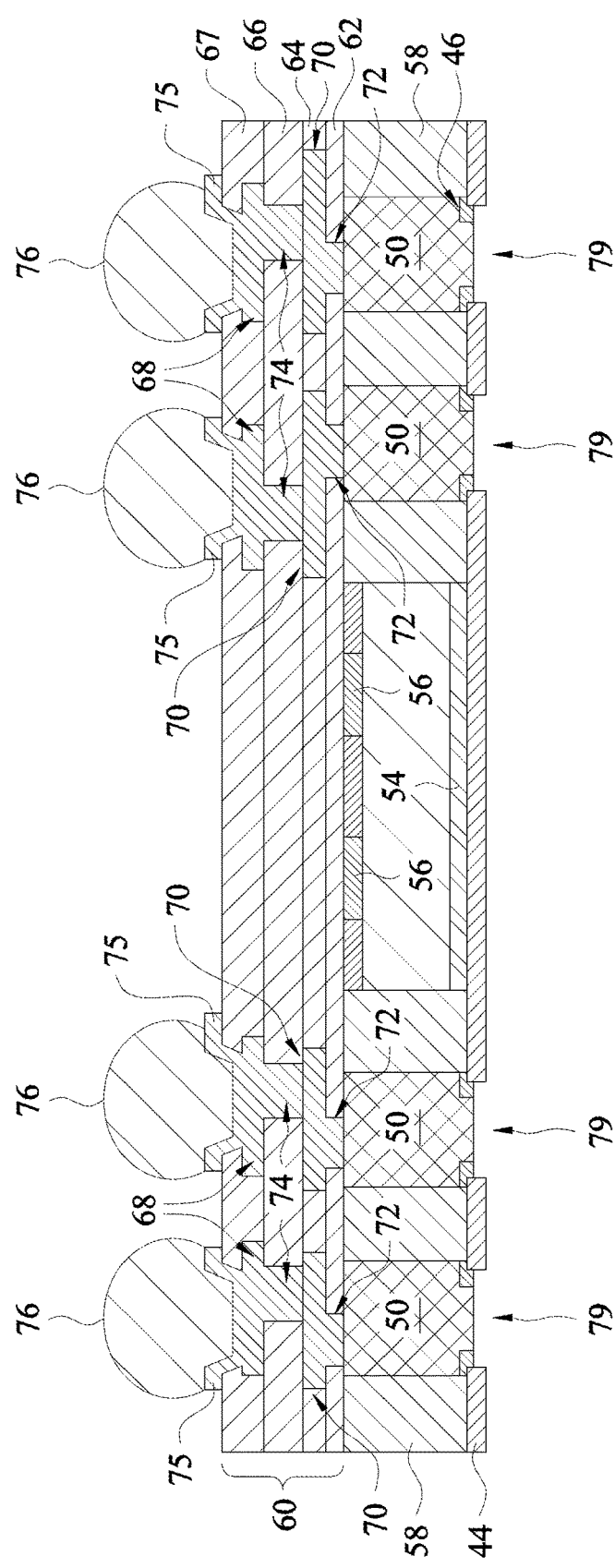

FIG. 14 illustrates removing the carrier substrate 40 and the release layer 42 to expose the first patterned layer 44, and a removal of one or more layers of seed layer 46 on the through vias 50 in accordance with some embodiments. In some embodiments, the de-bonding includes projecting a light such as a laser light or an UV light on the release layer 42 (see FIG. 13) so that the release layer decomposes under the heat of the light and the carrier substrate 40 can be removed. A cleaning and/or grinding process may be performed to remove residual portions of the release layer. In another embodiment, a thermal process, a chemical strip process, laser removal, a UV treatment, the like, or a combination thereof may be used. After the de-bonding of the carrier substrate 40 and the release layer 42, one or more layers of seed layer 46 are exposed. One or more layers of the seed layer 46 is removed by acceptable etching process, such as by wet or dry etching. The through vias 50 are then exposed after the removal of the exposed seed layer. In some embodiments, one or more of layers of the seed layer 46 may remain over the through vias 50. The thickness of removed layers of the seed layer 46 will control a recess depth between a surface distal to the encapsulant 58 of the first patterned layer 44 and an exposed surface of the seed layer 46 and/or the through vias 50. The recess is discussed in greater detail below with reference to FIGS. 17A-17C.

Figure 15:
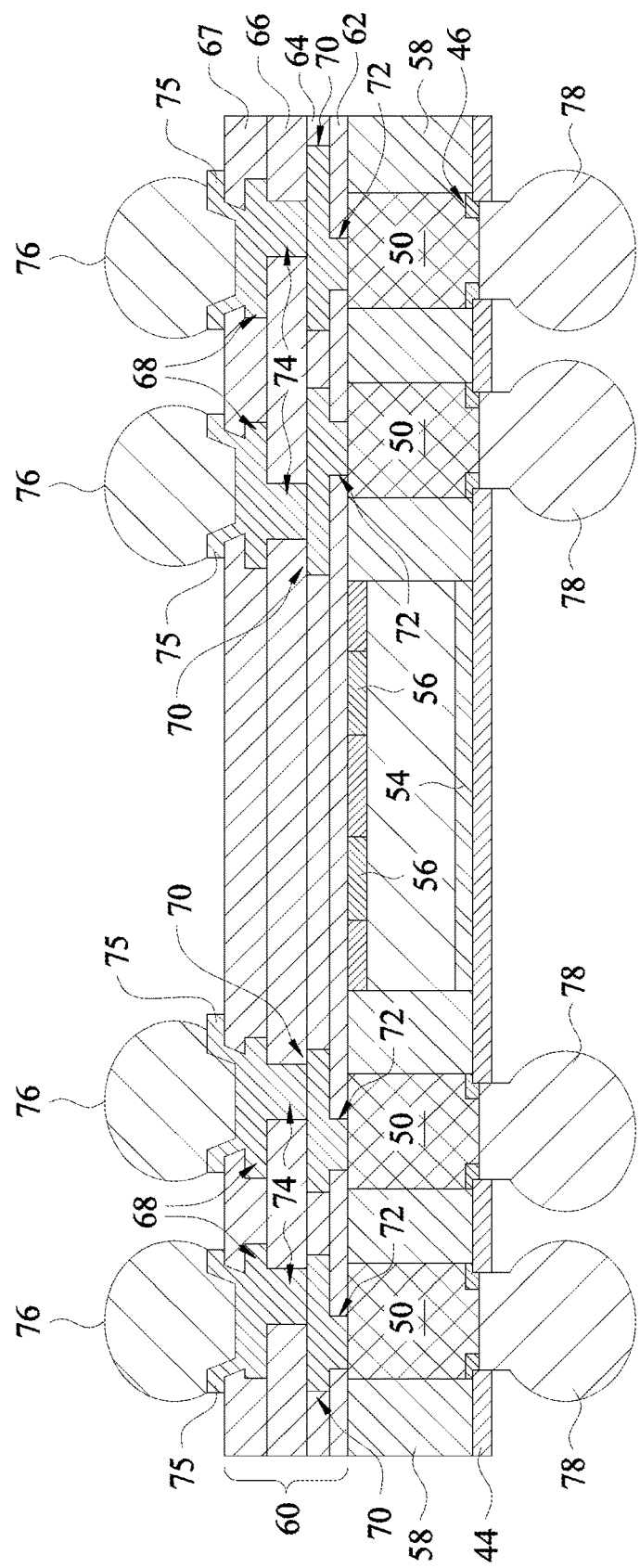

FIG. 15 illustrates the formation of a set of conductive connectors 78 over and electrically coupled to the through vias 50. The conductive connectors 78 may be solder balls, metal pillars, controlled collapse chip connection (C4) bumps, micro bumps, electroless nickel-electroless palladium-immersion gold technique (ENEPIG) formed bumps, or the like. The conductive connectors 78 may include a conductive material such as solder, copper, aluminum, gold, nickel, silver, palladium, tin, a combination thereof, or the like. In an embodiment in which the conductive connectors 78 are solder bumps, the conductive connectors 78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 78 are metal pillars (such as a copper pillar) formed by a sputtering, printing, electro plating, electroless plating, CVD, or the like. The metal pillars may be solder free and have substantially vertical sidewalls. A diameter of the conductive connectors 78 may be in a range from about 20 μm to about 500 μm.

Figure 16:
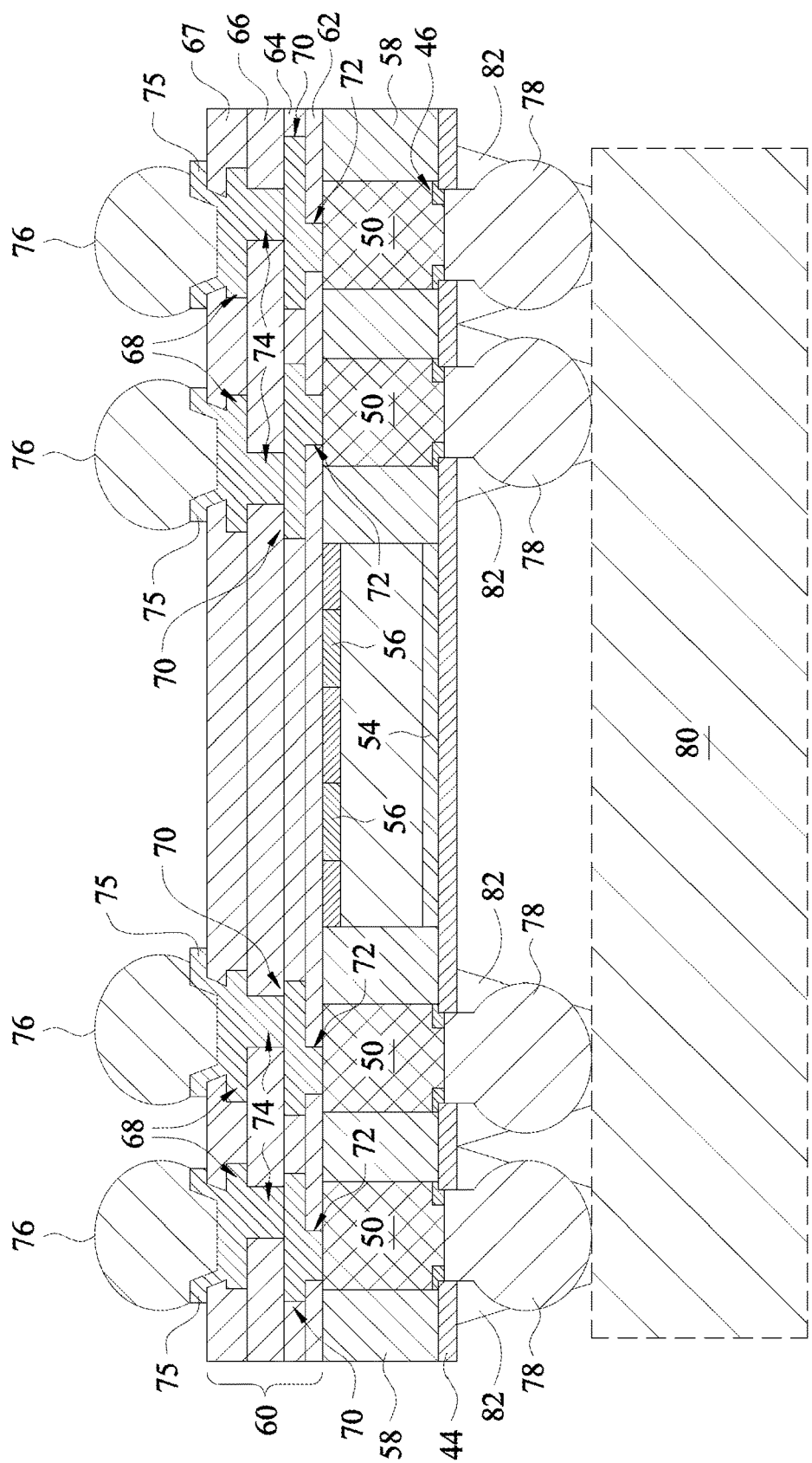

FIG. 16 illustrates the conductive connectors 78 electrically coupled to a substrate 80 with an additional adhesive support of an adhesive material 82 in accordance with some embodiments. The substrate 80 may be any substrate, such as an integrated circuit die, a package, a printed circuit board, an interposer, or the like. In some embodiments, the adhesive material 82 may be epoxy or glue, and it may be applied to the conductive connectors 78. In some embodiments, the conductive connectors 78 may attach directly to the through vias 50. Light or UV light may be used for solidifying the adhesive material 82 between the wafer 80 and the conductive connectors 78.

In some embodiments, UBM structures may also be utilized between the conductive connectors 78 and the through vias 50. The UBM structures may be similar to the UBMs 75.

Figure 17A:
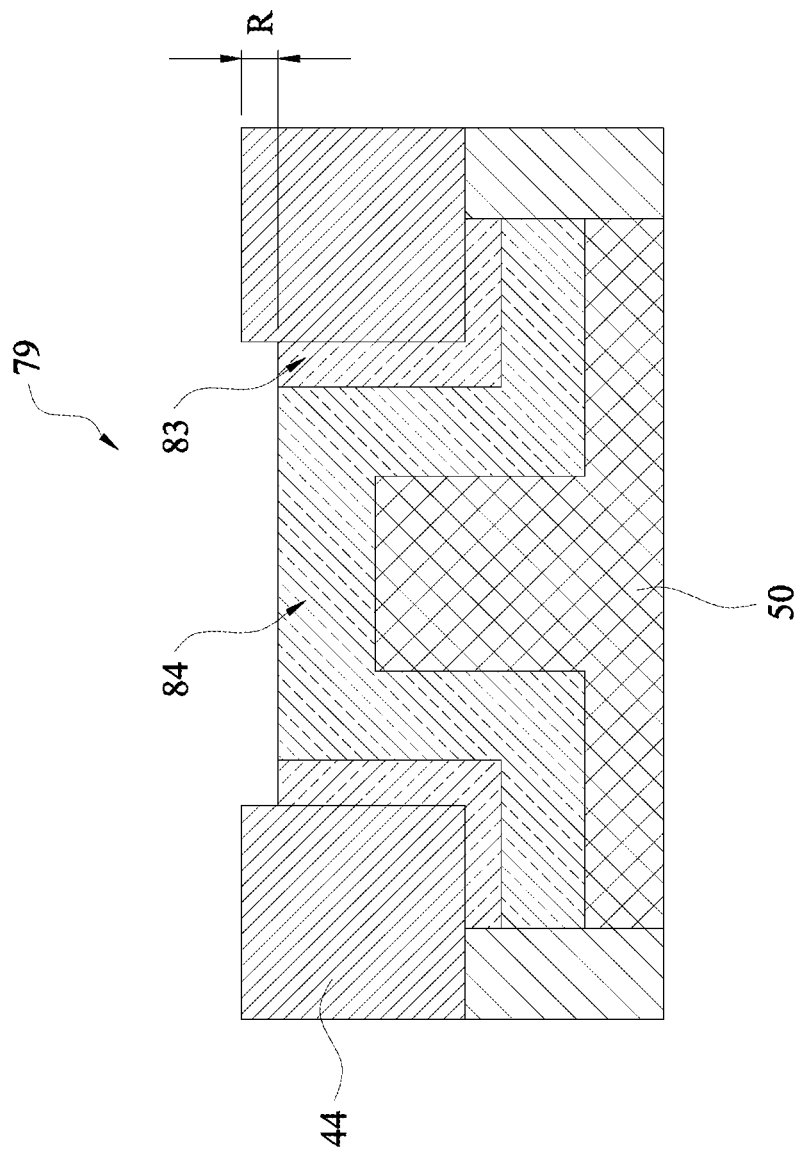
FIGS. 17A-17C illustrate various cross-sectional views of opening profiles for a through via in accordance with some embodiments.
Figure 17B:
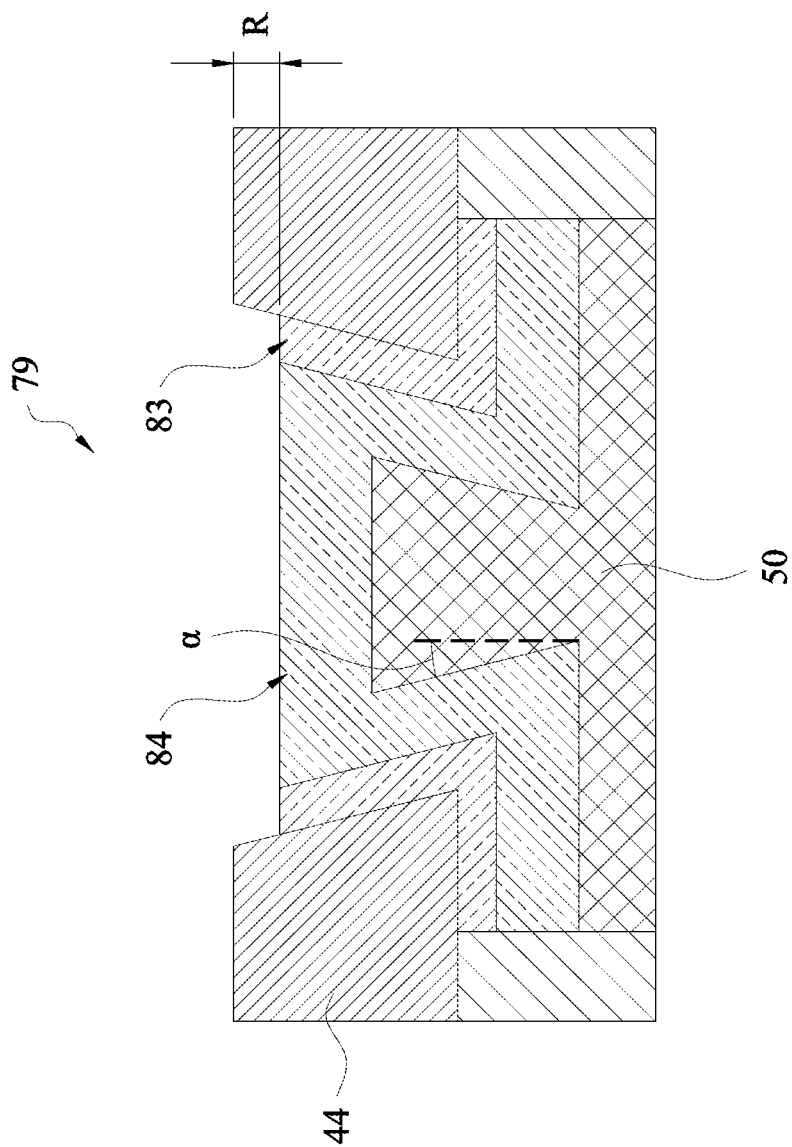
Figure 17C:
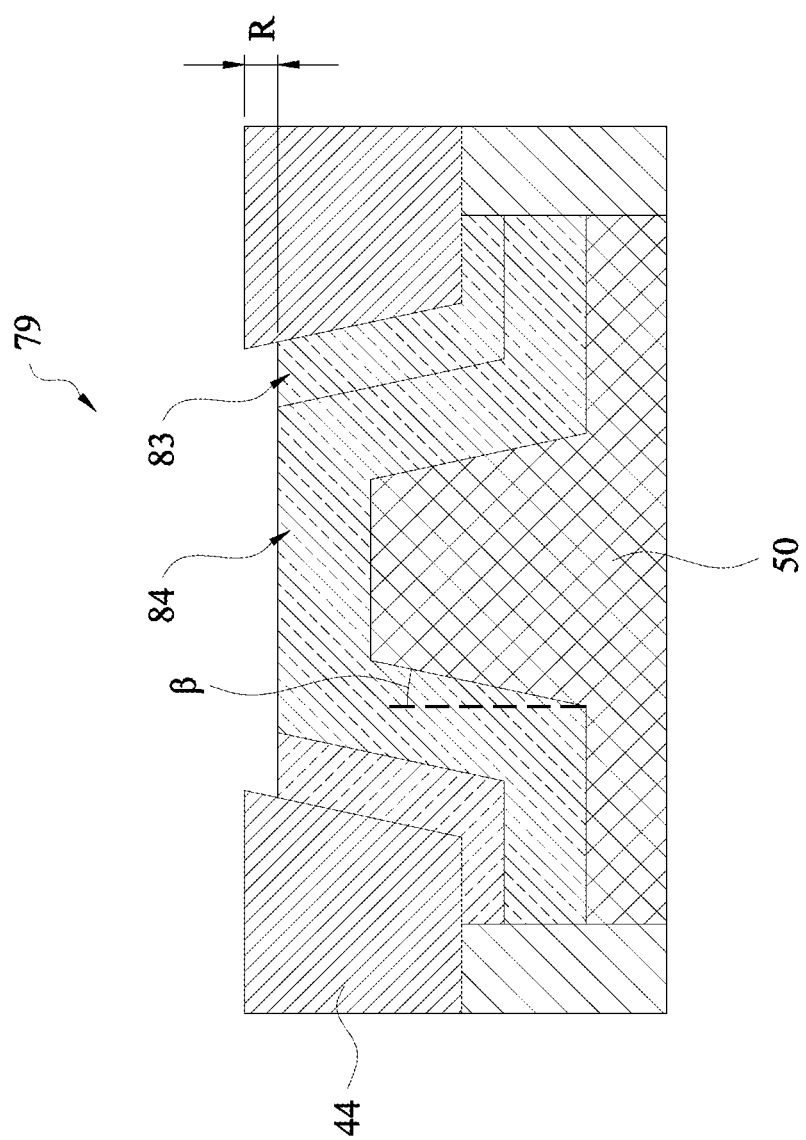

FIGS. 17A-17C illustrate various configurations of recesses 79 as illustrated in FIG. 14, in accordance with various embodiments. The use of a multi-layer seed layer allows the seed layers to be utilized to control a depth of the recess 79. For example, in embodiments such as those illustrated in FIGS. 17A-17C, a multi-layer seed layer 46 is utilized having a first seed layer 83 (such as a titanium layer) and a second seed layer 84 (such as a copper layer). In embodiments such as these, the thickness of the first seed layer 83 defines the depth of the recesses 79 by relying on the etch selectivity between the materials of the first seed layer 83 and the second seed layer 84 such that the second seed layer 84 acts as an etch stop layer for removing the first seed layer 83. In some embodiments, the first seed layer 83 has a thickness and the recesses 79 have a depth R of about 0.01 μm to about 5 μm. In other embodiments, the first seed layer 83 and the second seed layer 84 may be removed from the ends of the through vias 50, such that the seed layer 46 is completely removed and the through vias 50 are exposed.

FIGS. 17A-17C further illustrate various sidewall profiles for the openings 47 (see FIG. 3). For example, FIG. 17A illustrates an embodiment in which the projection of the through vias 50 has substantially vertical sidewalls extending through the first patterned layer 44. FIG. 17B illustrates an embodiment in which the projection of the through vias 50 has a positive taper extending through the first patterned layer 44, such that a width of the projection increases as the projection extends outward away from a central body of the through vias 50. In an embodiment, the sidewalls of the projection have a positive taper angle (α) of about 5 degrees to about 85 degrees. The angle (α) of the positive taper may be adjusted by a dose from about 500 mJ/cm$^2$ to about 1000 mJ/cm$^2$, and a focus depth from about 5 μm to about 10 μm during the lithography process.

FIG. 17C illustrates an embodiment in which the projection of the through vias 50 has a negative taper extending through the first patterned layer 44, such that a width of the projection decreases as the projection extends outward away from a central body of the through vias 50. In an embodiment, the sidewalls of the projection have a negative taper angle (β) of about 5 degrees to about 85 degrees. The angle (β) of the positive taper may be adjusted by a dose from about 100 mJ/cm$^2$ to about 500 mJ/cm$^2$, and a focus depth from about 15 μm to about 20 μm during the lithography process. The taper of the projection of the through vias 50 may be adjusted to reduce stress in a particular design.

Embodiments such as those disclosed herein allow contact to be made to the through vias 50 without the use of processes that may cause more damage or provide less control. For example, embodiments such as those herein utilize openings in the first patterned layer 44 and the seed layer structure to form recesses to the through vias 50, relying on well-controlled selective etching processes, as opposed to laser drilling openings through a dielectric layer to provide electrical contact to the through vias. Techniques such as laser drilling may cause damage and provide less control over the profile and critical dimensions.

Figure 18:
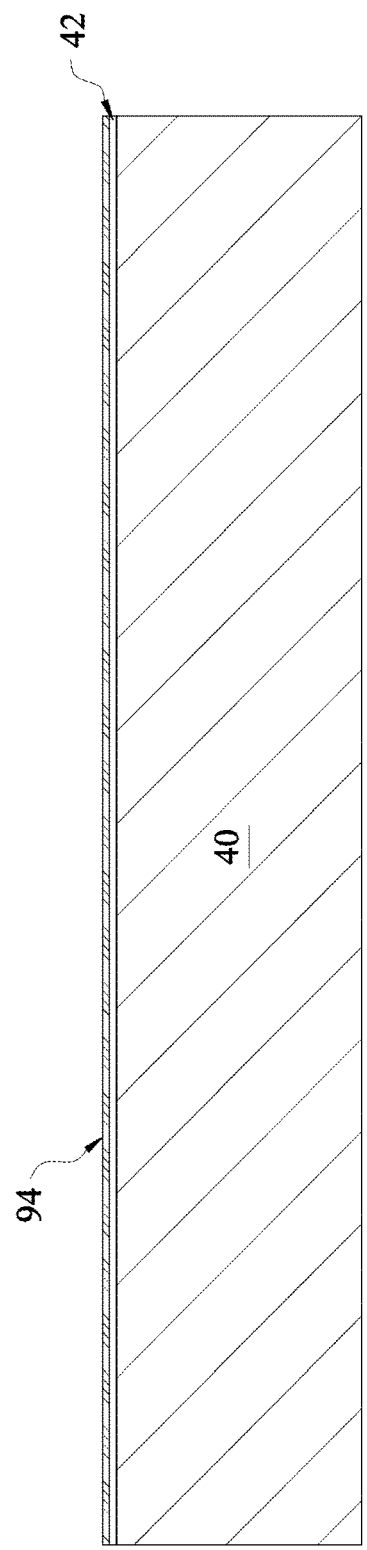
FIGS. 18-31 are cross-sectional views of various intermediate steps of forming semiconductor device in accordance with some embodiments.
Figure 19:
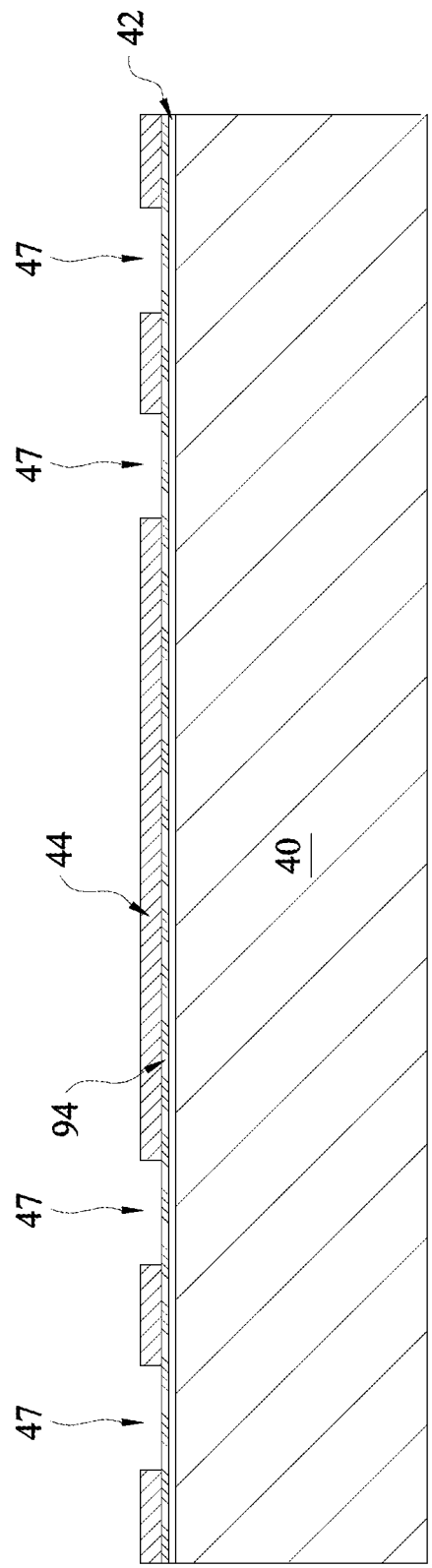
Figure 20:
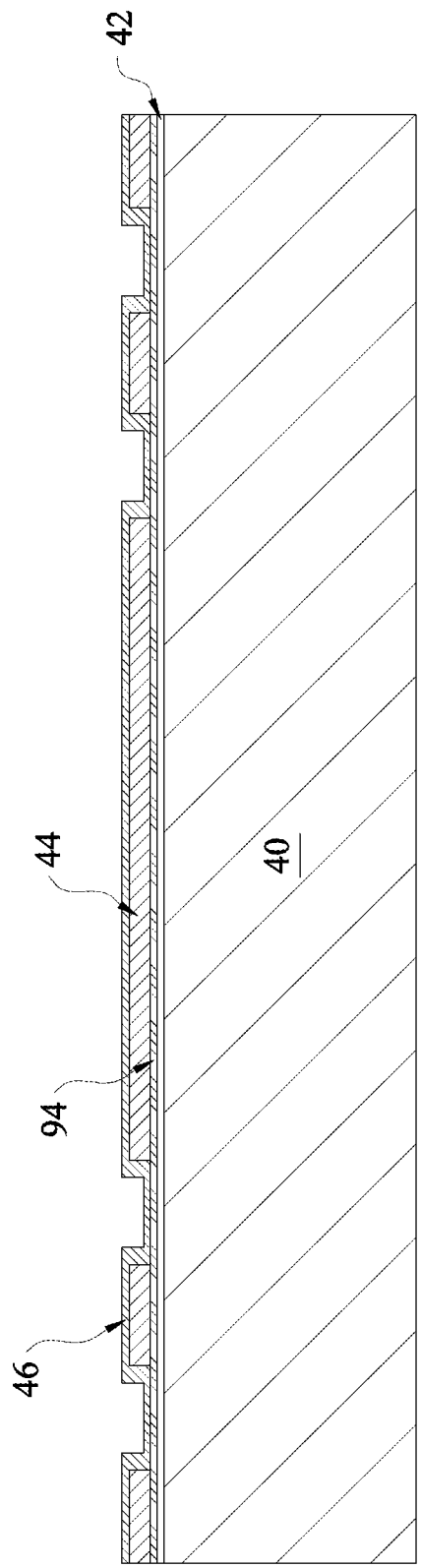
Figure 21:
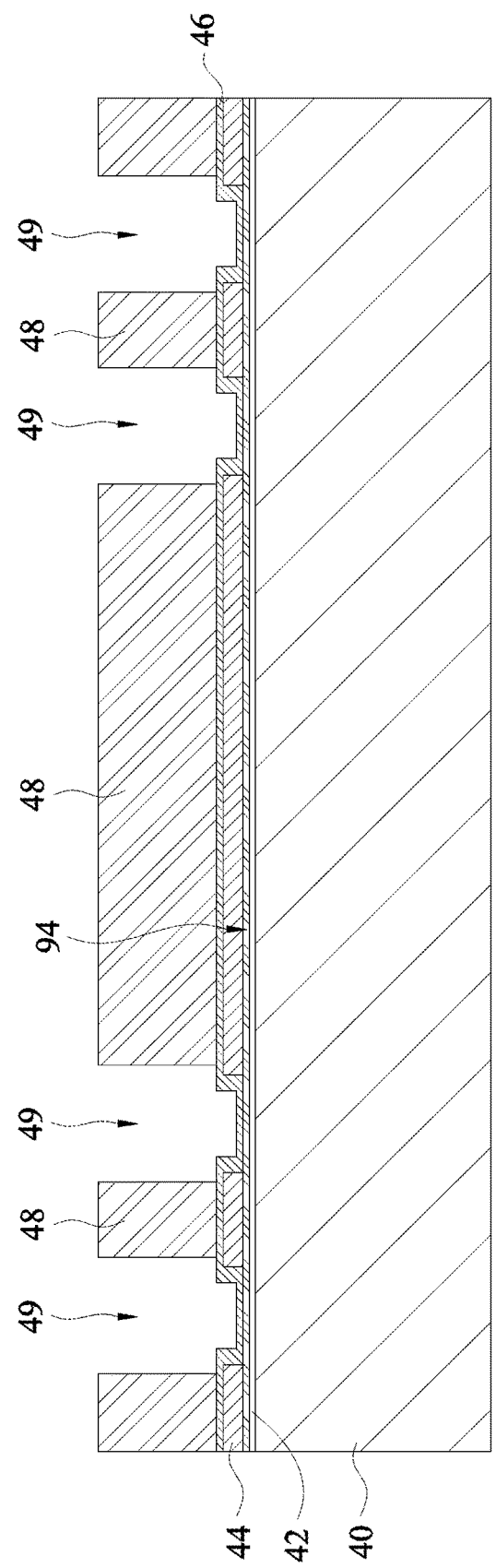
Figure 22:
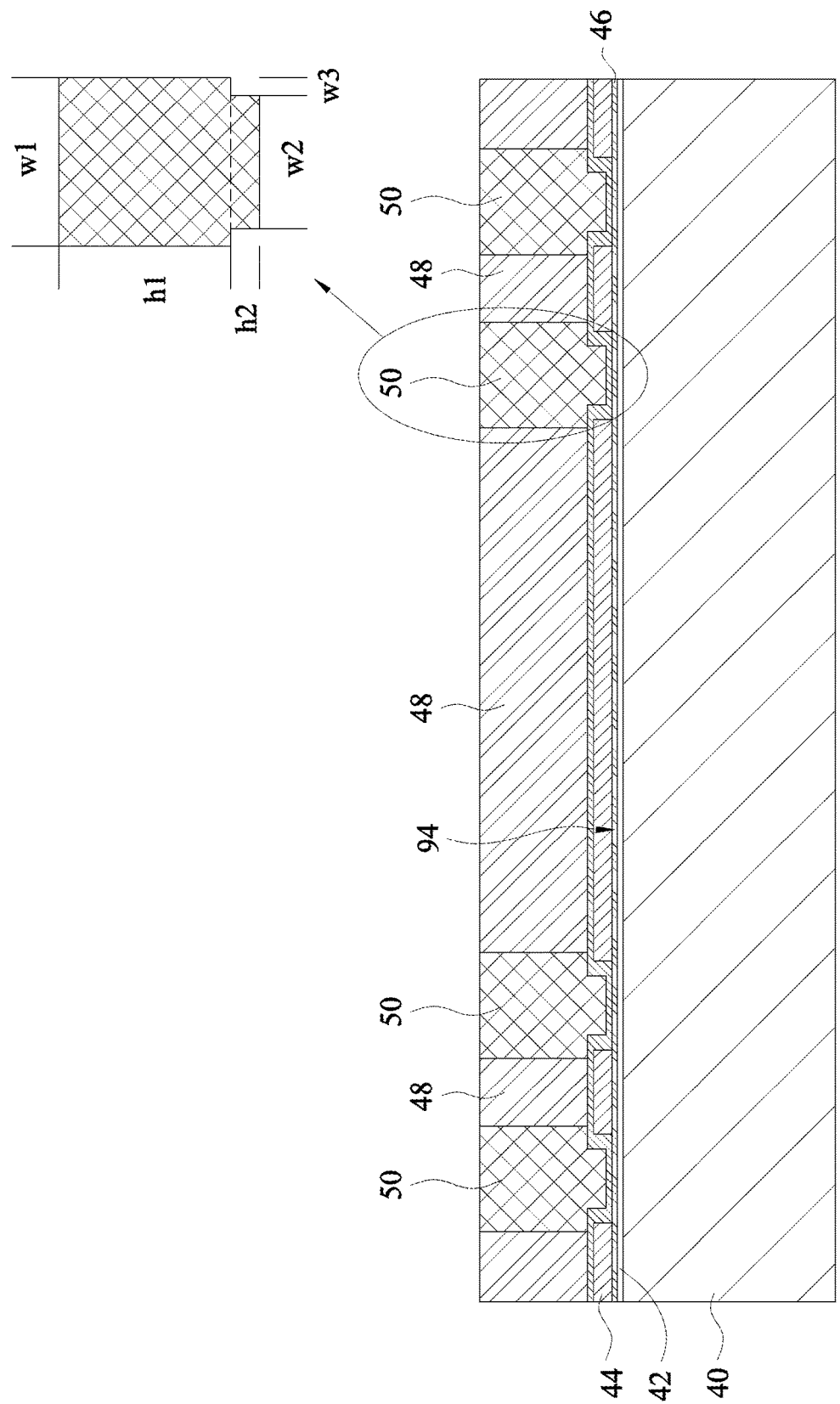
Figure 23:
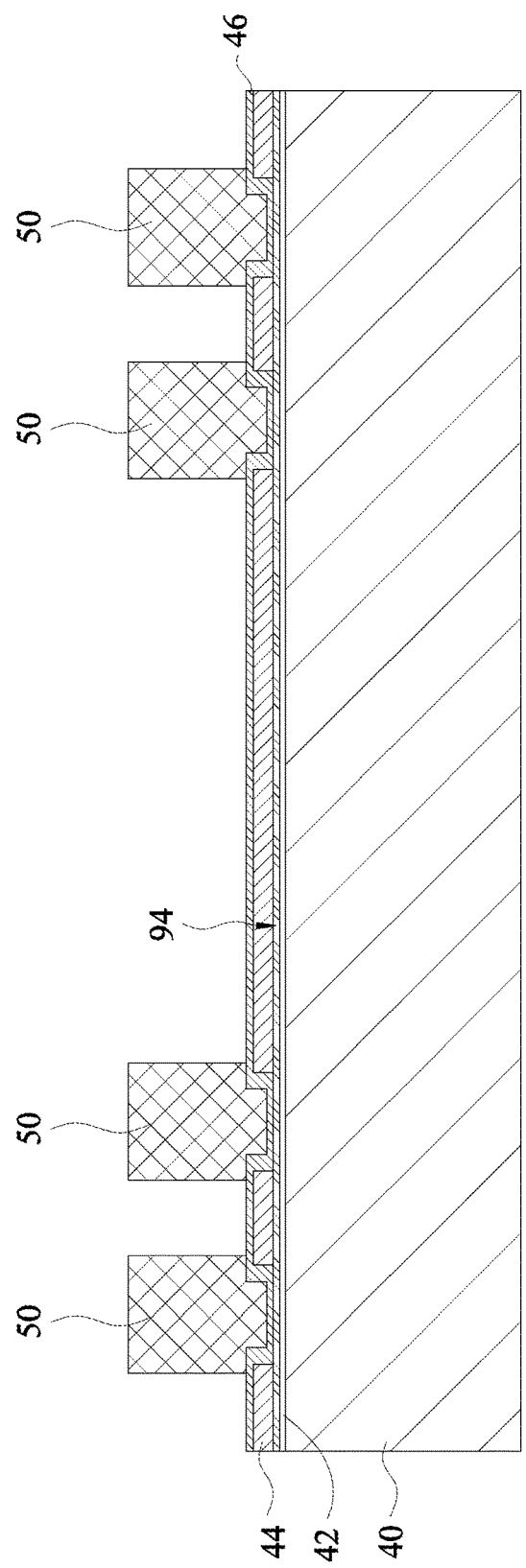
Figure 24:
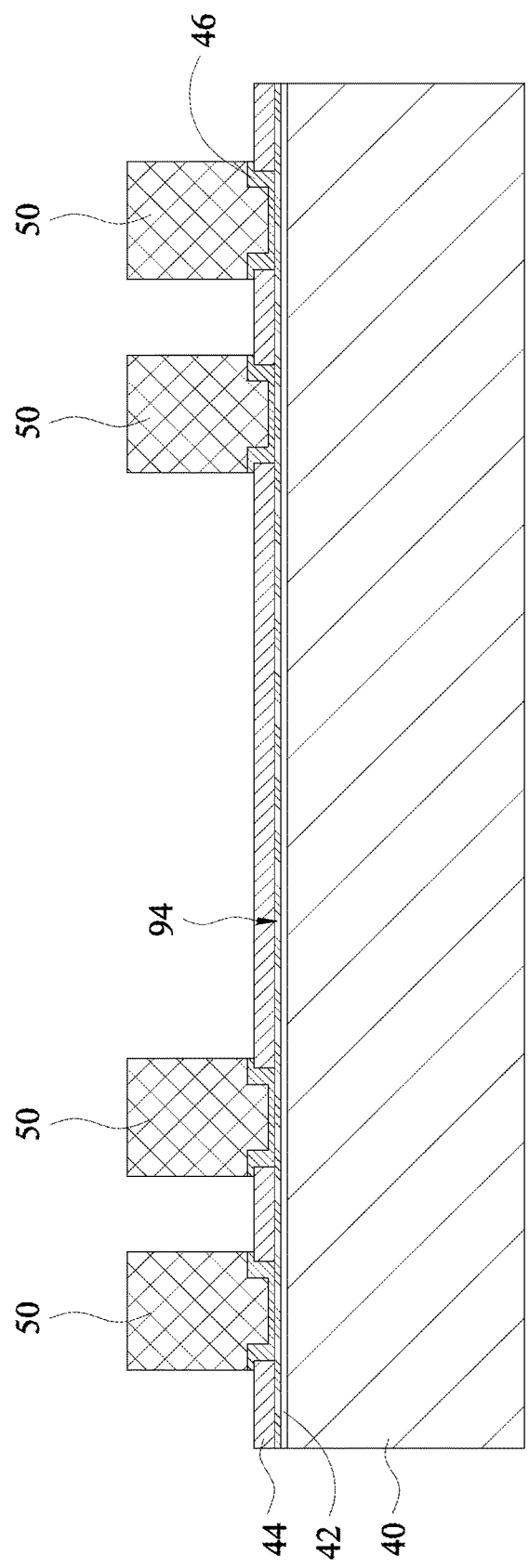
Figure 25:
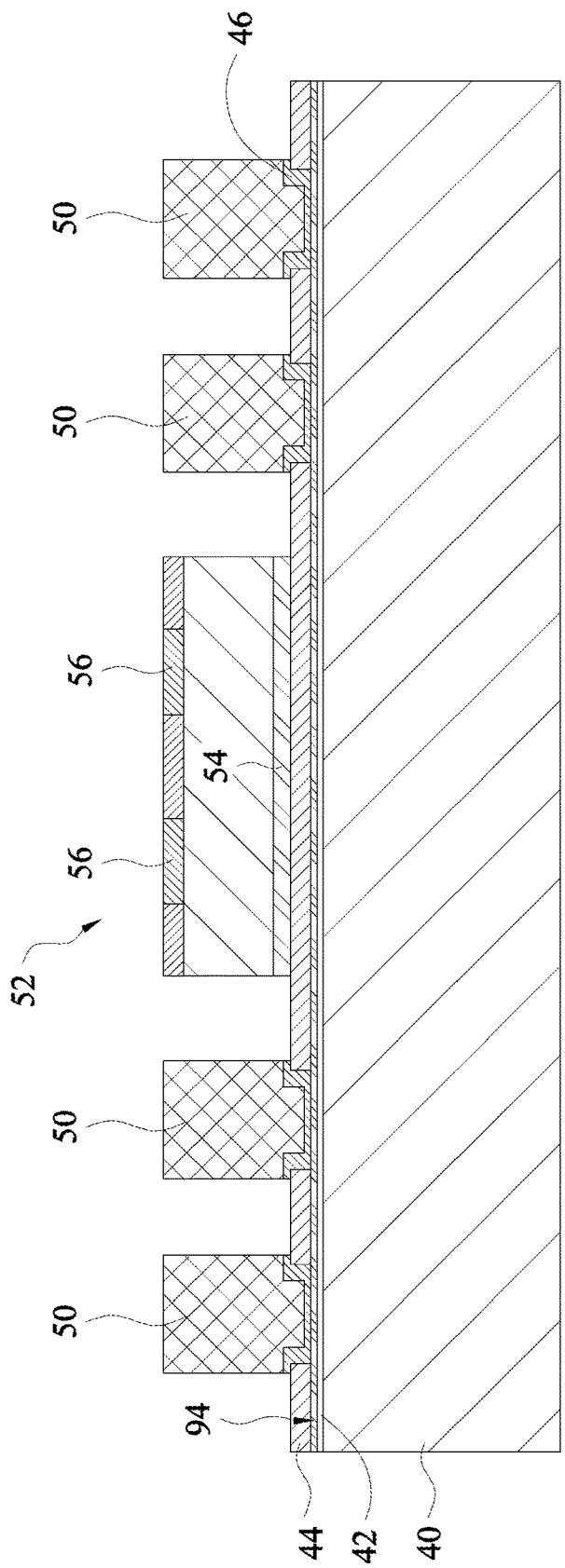
Figure 26:
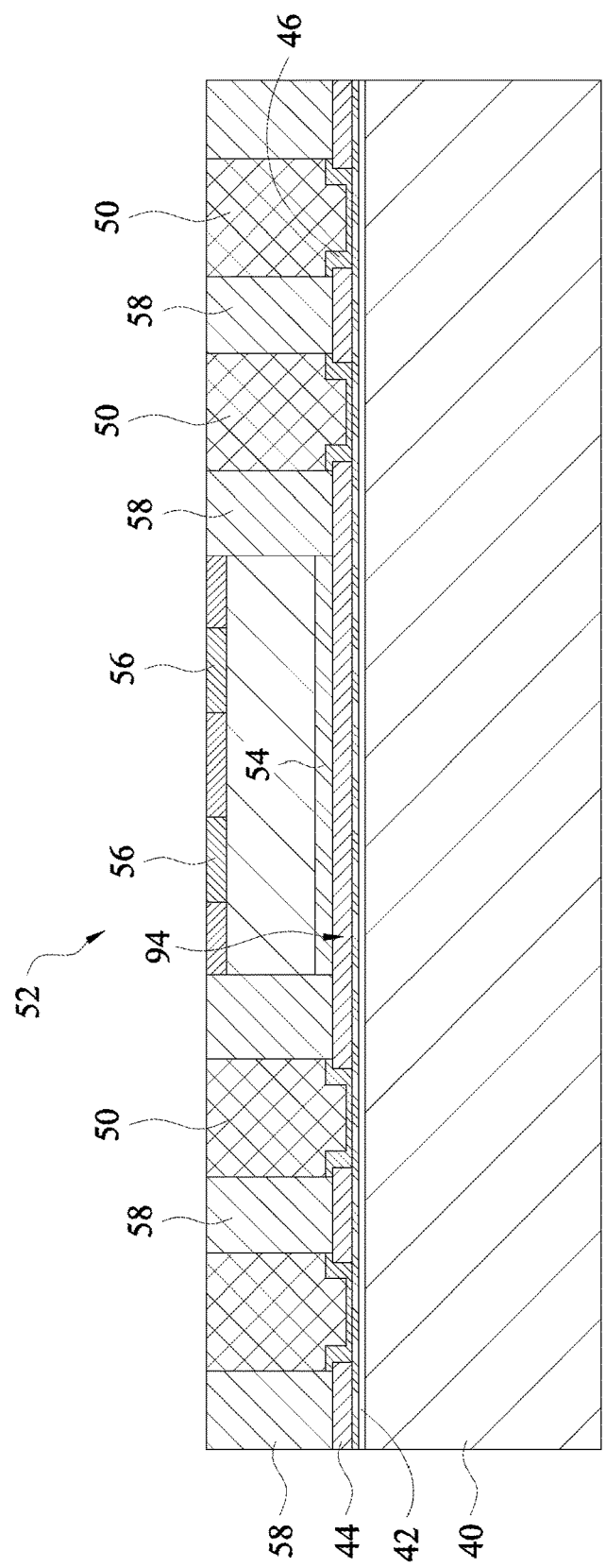
Figure 27:
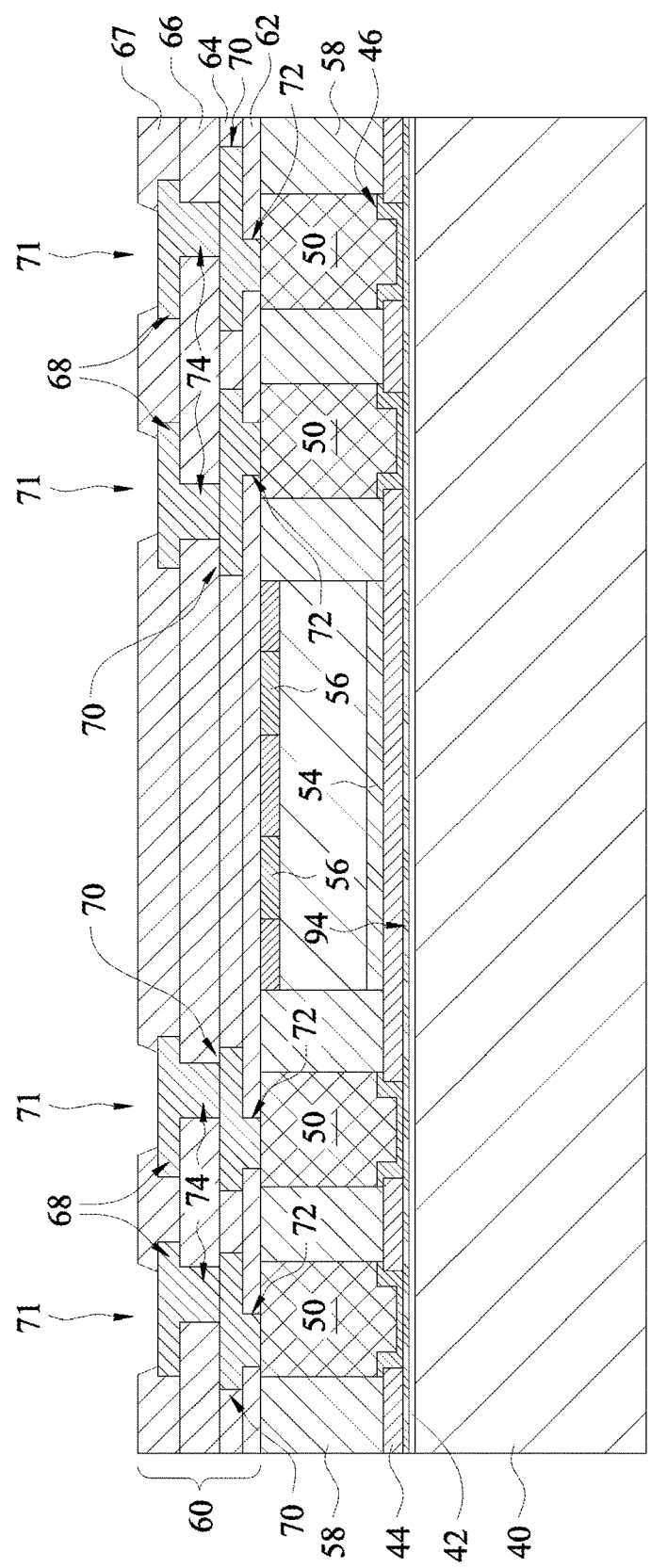
Figure 28:
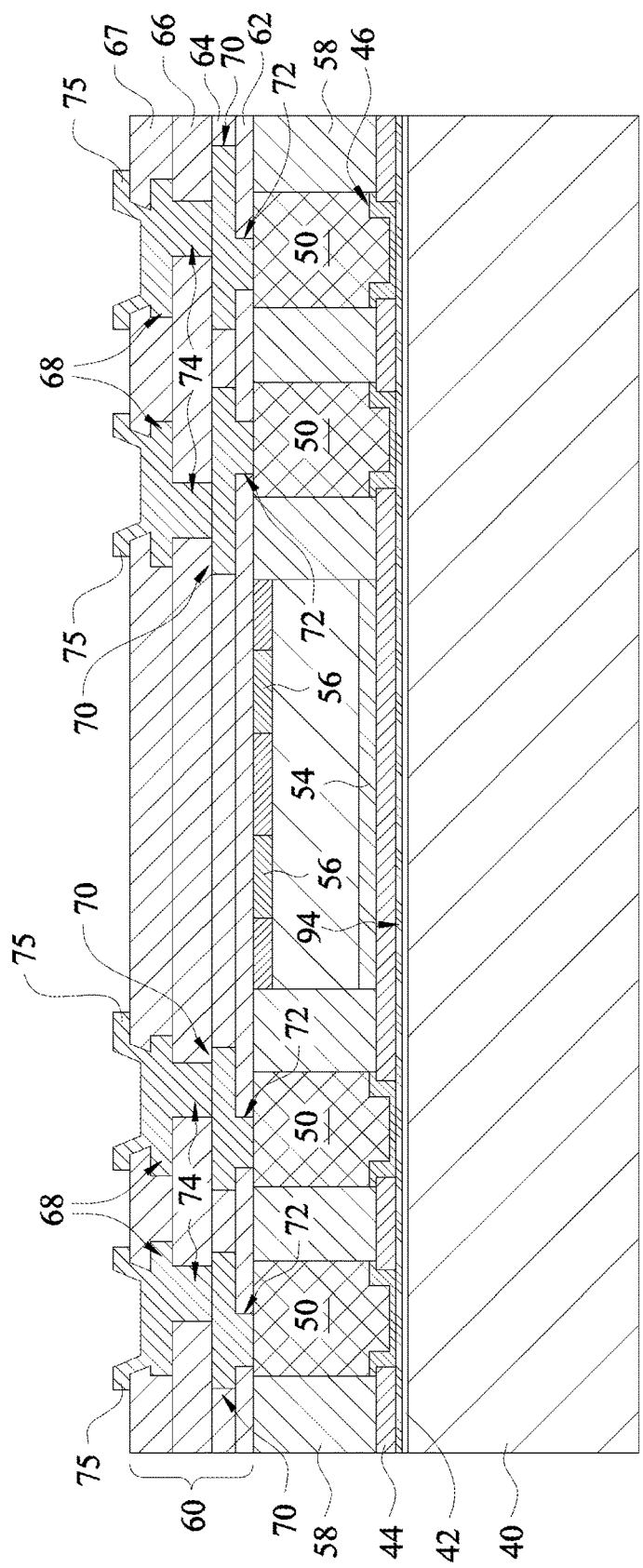
Figure 29:
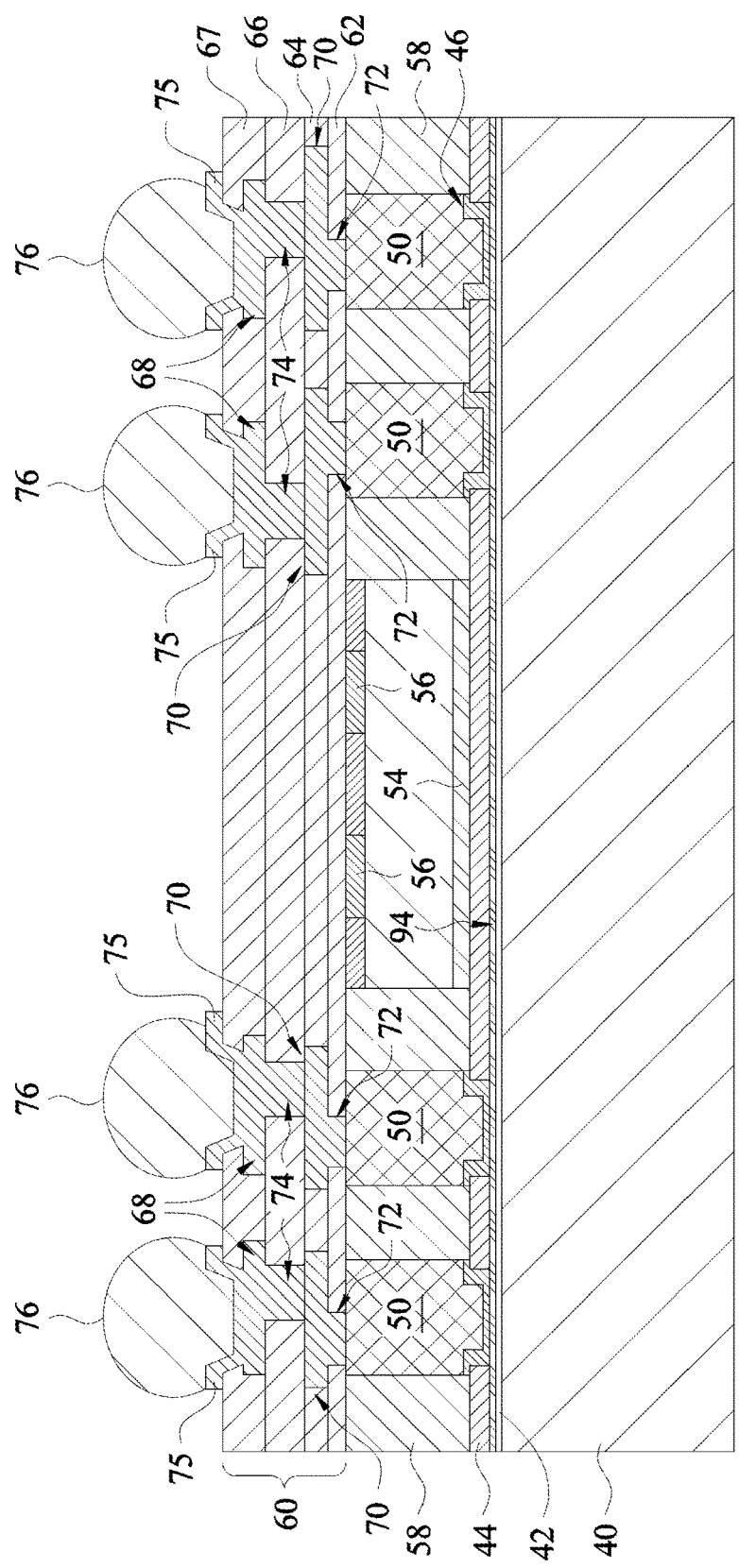
Figure 30:
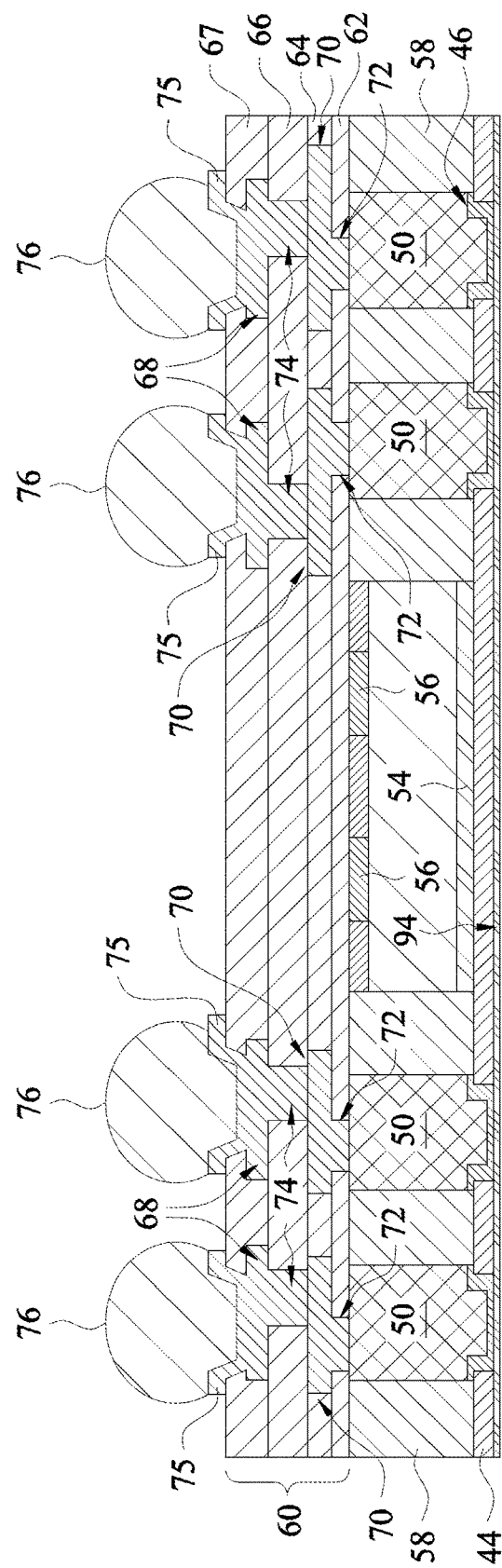

FIGS. 18 through 31 illustrate cross-sectional views of the various intermediate stages of manufacturing a package structure in accordance with some embodiments. The embodiment illustrated in FIGS. 18-31 may utilize many similar structures and processes as discussed above with reference to FIGS. 1-16 and FIGS. 17A-17C, wherein like reference numbers refer to like elements that may be formed of similar materials using similar processes. Other materials and processes, however, may be utilized. Referring now to FIG. 18, there is shown a sacrificial layer 94 formed on the release layer 42 and carrier substrate 40, wherein some embodiments may utilize the carrier substrate 40 and the release layer 42 as described above with reference to FIGS. 1 and 2. As will be discussed below, a structure will be formed on the carrier substrate 40 and then the carrier substrate 40 will be subsequently removed. The sacrificial layer 94 provides a protective layer to protect the subsequently formed polymer layer 44 (see FIG. 19) during the subsequent removal of the carrier substrate 40 and release layer 42 (see, e.g., FIG. 29). After the removal process, the polymer layer 44 remains flat.

In some embodiments, the sacrificial layer 94 may be a polymer layer or a metal layer. The polymer layer may be, for example, a hexamethyldisilazane (HMDS) layer, or the like, and the metal layer may be, for example, a titanium (Ti) layer, or the like. The polymer layer may be deposited by spin coating, and the metal layer may be deposited by Chemical Vapor Deposition (CVD), Physical Vapor Deposition (PVD), sputtering, or the like. In some embodiments, the thickness of the HMDS layer is in a range from about 0.01 μm to about 5 μm. In another embodiment, the sacrificial layer 94 is a Ti layer formed by, for example, sputtering, CVD, PVD, or the like. The thickness of the Ti layer is in a range from about 0.01 μm to about 5 μm.

FIGS. 19 through 30 illustrate subsequent cross-sectional views of various intermediate steps, similar to those illustrated in FIGS. 3-14, respectively. Similar processes and materials may be used and will not be repeated herein, wherein like reference numbers refer to like elements.

Figure 31:
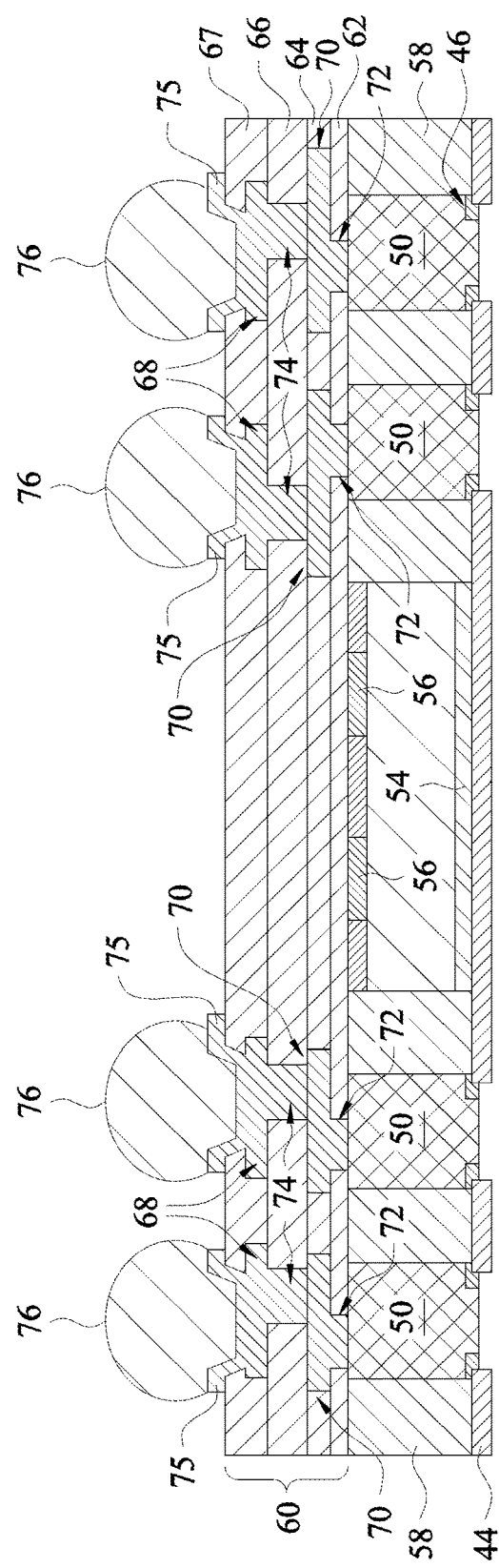

Referring now to FIG. 31, removal of the sacrificial layer 94 (see FIG. 30) and one or more layers of seed layer 46 are illustrated in accordance with some embodiments. The sacrificial layer 94 and the one or more layers of seed layer 46 may be removed by, for example, using an acceptable etching process, such as by wet or dry etching, to expose at least a portion of the first patterned layer 44 and the through vias 50. The removal of the sacrificial layer 94 and the removal of one or more layers of seed layer 46 expose the through vias 50 and create recesses 79 as discussed above with reference to FIGS. 17A-17C. The through vias 50 may be further electrically coupled to another semiconductor structures. The HMDS layer may be removed by, for example, plasma ashing, rinsing in Acetone, Isopropanol, or the like. The Ti layer may be removed by wet etching or dry etching. Thereafter, subsequent processing may be performed. For example, processing such as that discussed above with reference to FIGS. 15 and 16 to form conductive connectors 78 (see FIG. 15) and to couple a substrate 80 using the conductive connectors 78 and an adhesive material 82 (see FIG. 16). Similar processes and materials may be used as in FIGS. 15 and 16, and will not be repeated herein.

In some embodiments, a method of manufacturing a semiconductor device is provided. The method includes forming a first layer over a carrier substrate and forming first openings in the first layer. Through vias are formed over the first layer, such that the through vias extend into the first openings. An integrated circuit is placed over the first layer, and a molding compound is formed over the first layer, the molding compound extending along sidewalls of the integrated circuit and the through vias. A redistribution layer may be formed on the integrated circuit and the through vias. The carrier substrate is removed.

In another embodiment, a method of manufacturing a semiconductor device is provided. The method includes forming a first layer on a carrier substrate and forming openings in the first layer. One or more seed layers are formed along sidewalls and a bottom of the openings, over which through vias are formed such that the through vias extend into the openings. An integrated circuit is placed on the first layer, and a molding compound is formed on the first layer, the molding compound being interposed between the integrated circuit and the through vias. The carrier substrate may be removed.

In yet another embodiment, a semiconductor device is provided. The semiconductor device includes a first layer having an opening, and an integrated circuit on the first layer. An encapsulant is positioned on the first layer adjacent the integrated circuit, the encapsulant having a through via extending therethrough, the through via extending into the opening. The portion of the through via extending through the encapsulant has a width greater than the portion of the through via extending into the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first layer over a carrier substrate;
   forming openings in the first layer;
   forming one or more seed layers along sidewalls and a bottom of the openings;
   forming through vias on the one or more seed layers, the through vias extending into the openings;
   placing an integrated circuit on the first layer, the integrated circuit being physically interposed between a first through via and a second through via of the through vias in a cross-sectional view;
   forming a molding compound on the first layer, the molding compound being interposed between the integrated circuit and the through vias;
   planarizing the molding compound such that top surfaces of the molding compound, the integrated circuit, and the through vias are planar;
   after planarizing the molding compound, removing the carrier substrate; and
   after removing the carrier substrate, removing at least one seed layer of the one or more seed layers.

2. The method of claim 1, further comprising, prior to forming the first layer over the carrier substrate, forming a sacrificial layer over the carrier substrate, wherein the first layer is formed over the sacrificial layer.

3. The method of claim 2, wherein:
   the openings in the first layer are formed after forming the first layer;
   the molding compound is formed after forming the through vias and after placing the integrated circuit;
   the molding compound is physically interposed between the integrated circuit and the through vias; the sacrificial layer comprises a first insulating material;
   the first layer comprises a second insulating material;
   the first layer is formed after forming the sacrificial layer; and
   at least a portion of the sacrificial layer is removed after removing the carrier substrate.

4. The method of claim 2, wherein the sacrificial layer comprises a conductive material.

5. The method of claim 1, wherein the removing at least one seed layer further comprises forming a recess comprising an aperture and a bottom.

6. The method of claim 5, wherein the width of the bottom of the recess is greater than the width of the aperture of the recess, thereby forming a negative taper, the negative taper having a negative taper angle of 5 degrees to 85 degrees.

7. The method of claim 5, wherein the width of the aperture is greater than the width of the bottom of the recess, thereby forming a positive taper, the positive taper having a positive taper angle of 5 degrees to 85 degrees.

8. The method of claim 5, further comprising forming solder joints on the through vias, the solder joints extending into the recess.

9. The method of claim 1, wherein forming the one or more seed layers comprises forming the one or more seed layers on an upper surface of the first layer.

10. A method of manufacturing a semiconductor device, the method comprising:
    forming a first layer over a carrier substrate, the first layer being formed of an insulating material;
    after forming the first layer, forming openings in the first layer;
    after forming the openings in the first layer, forming one or more seed layers along sidewalls and a bottom of the openings;
    after forming the one or more seed layers, forming through vias on the one or more seed layers extending into the openings;
    after forming the openings in the first layer, placing an integrated circuit on the first layer, the integrated circuit having a first side and a second side opposite the first side, the integrated circuit having contact pads on the first side, the second side being interposed between the first side and the first layer;
    after forming the through vias and after placing the integrated circuit, forming a molding compound on the first layer, the molding compound being physically interposed between the integrated circuit and the through vias, an upper surface of the molding compound being planar with upper surfaces of the through vias and an upper surface of the integrated circuit;
    after forming the molding compound, removing the carrier substrate; and
    after removing the carrier substrate, removing at least a portion of one or more of the one or more seed layers.

11. The method of claim 10, wherein the molding compound extends along sidewalls of the integrated circuit and the through vias.

12. The method of claim 11, the removing at least a portion of one or more of the one or more seed layers further comprising forming a recess.

13. The method of claim 12, further comprising forming a redistribution layer on the integrated circuit and the through vias.

14. The method of claim 12, further comprising, prior to forming the first layer over the carrier substrate, forming a sacrificial layer over the carrier substrate, wherein the first layer is formed over the sacrificial layer.

15. The method of claim 14, wherein:
    the integrated circuit is physically interposed between a first through via and a second through via of the through vias in a cross-sectional view;
    the sacrificial layer comprises a first insulating material;
    the first layer comprises a second insulating material; and
    at least a portion of the sacrificial layer is removed after removing the carrier substrate.

16. The method of claim 12, further comprising forming solder joints on the through vias, the solder joints extending into the recess.

17. A method of manufacturing a semiconductor device, the method comprising:
    forming a sacrificial layer over a carrier substrate, the sacrificial layer comprising a first insulating material;
    after forming the sacrificial layer, forming a first layer over the sacrificial layer, the first layer comprising a second insulating material;
    forming openings in the first layer;
    after forming the openings, forming one or more seed layers along sidewalls and a bottom of the openings;
    after forming the one or more seed layers, forming through vias on the seed layers, the through vias extending into the openings;

placing an integrated circuit on the first layer, the integrated circuit having an active side and a backside, the backside being interposed between the active side and the first layer;

forming a molding compound on the first layer, the molding compound being physically interposed between the integrated circuit and the through vias, the molding compound being physically interposed between the through vias;

planarizing the molding compound such that a top surface of the molding compound is planar with top surfaces of the through vias and the active side of the integrated circuit;

after planarizing the molding compound, removing the carrier substrate; and after removing the carrier substrate, removing at least a portion of the sacrificial layer.

18. The method of claim 17, further comprising, after removing at least a portion of the sacrificial layer, removing at least a portion of one or more of the one or more seed layers, thereby forming a recess.

19. The method of claim 17, further comprising forming a redistribution layer on the integrated circuit and the through vias.

20. The method of claim 17, wherein:
the integrated circuit is physically interposed between a first through via of the through vias and a second through via of the through vias in a cross-sectional view;
the openings in the first layer are formed after forming the first layer; and
the molding compound is formed after forming the through vias and after placing the integrated circuit.

* * * * *